United States Patent

(12) United States Patent
Sakai et al.

(10) Patent No.: US 12,718,857 B2
(45) Date of Patent: Aug. 25, 2026

(54) MAGNETORESISTIVE EFFECT MEMORY, MEMORY ARRAY, AND MEMORY SYSTEM

(71) Applicant: SONY SEMICONDUCTOR SOLUTIONS CORPORATION, Kanagawa (JP)

(72) Inventors: Lui Sakai, Kanagawa (JP); Masanori Hosomi, Kanagawa (JP); Yutaka Higo, Kanagawa (JP); Keizo Hiraga, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 112 days.

(21) Appl. No.: 18/709,017

(22) PCT Filed: Oct. 31, 2022

(86) PCT No.: PCT/JP2022/040609

§ 371 (c)(1),
(2) Date: May 9, 2024

(87) PCT Pub. No.: WO2023/090132

PCT Pub. Date: May 25, 2023

(65) Prior Publication Data

US 2025/0006237 A1 Jan. 2, 2025

(30) Foreign Application Priority Data

Nov. 17, 2021 (JP) ................................ 2021-186865

(51) Int. Cl.
*G11C 11/16* (2006.01)
*H01F 10/32* (2006.01)
(Continued)

(52) U.S. Cl.
CPC ........ *G11C 11/161* (2013.01); *G11C 11/1659* (2013.01); *G11C 11/1673* (2013.01);
(Continued)

(58) Field of Classification Search
CPC ............. G11C 11/161; G11C 11/1675; G11C 11/1673; G11C 11/1659; G11C 11/1655;
(Continued)

(56) References Cited

U.S. PATENT DOCUMENTS

2020/0083288 A1* 3/2020 Kanaya .............. G11C 11/1655

FOREIGN PATENT DOCUMENTS

JP 2016-225633 A 12/2016
JP 2018-092696 A 6/2018
(Continued)

OTHER PUBLICATIONS

International Search Report and Written Opinion of PCT Application No. PCT/JP2022/040609, issued on Jan. 31, 2023, 09 pages of ISRWO.

*Primary Examiner* — Amir Zarabian
(74) *Attorney, Agent, or Firm* — CHIP LAW GROUP

(57) ABSTRACT

Provided is a magnetoresistive effect memory that includes a magnetoresistive effect element. The magnetoresistive effect element provided in the magnetoresistive effect memory includes a voltage-controlled magnetic anisotropy effect layer (first magnetization free layer that is a magnetization free layer having a variable magnetization direction and has a voltage-controlled magnetic anisotropy effect, a non-voltage-controlled magnetic anisotropy effect layer (second magnetization free layer that is a magnetization free layer having a variable magnetization direction and has no voltage-controlled magnetic anisotropy effect, and a magnetization fixed layer that has a magnetic anisotropy and has an invariable magnetization direction.

11 Claims, 25 Drawing Sheets

(51) Int. Cl.
*H10B 61/00* (2023.01)
*H10N 50/10* (2023.01)
*H10N 50/85* (2023.01)

(52) U.S. Cl.
CPC ...... *G11C 11/1675* (2013.01); *H01F 10/3286* (2013.01); *H10B 61/22* (2023.02); *H10N 50/10* (2023.02); *H10N 50/85* (2023.02)

(58) Field of Classification Search
CPC ............ G11C 11/1657; G11C 11/1697; G11C 11/165; G11C 11/404; G11C 11/407; G11C 13/004; G11C 11/16; G11C 11/1693; G11C 13/0026; G11C 13/0061; G11C 13/0069; G11C 11/155; G11C 11/1653; G11C 13/0028; G11C 2013/0057; G11C 2213/71; G11C 2213/72; G11C 2213/74; G11C 7/1006; G11C 11/1677; G11C 13/0038; G11C 13/0064; G11C 2013/0076; G11C 2013/0092; G11C 2213/79; H10B 61/22; H10B 61/10; H10B 61/00; H10B 12/033; H10N 50/10; H10N 50/85; H10N 50/80; H10N 50/01; H10N 50/02
See application file for complete search history.

(56) References Cited

FOREIGN PATENT DOCUMENTS

| | | |
|---|---|---|
| JP | 2018-157091 A | 10/2018 |
| JP | 2019-057598 A | 4/2019 |
| JP | 2020-043282 A | 3/2020 |

* cited by examiner

FIG.4

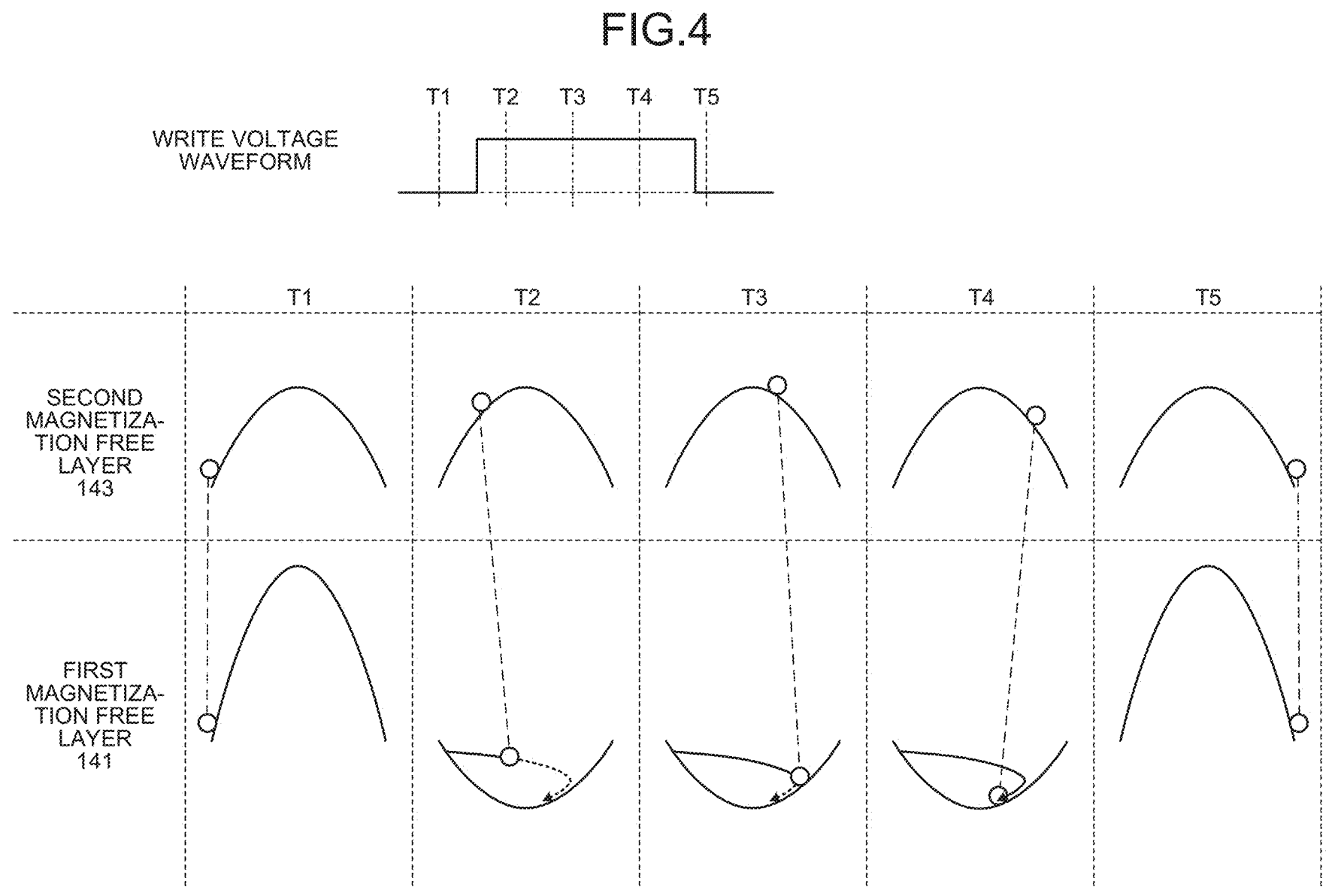

WRITE VOLTAGE WAVEFORM

T1 T2 T3 T4 T5

SECOND MAGNETIZATION FREE LAYER 143

FIRST MAGNETIZATION FREE LAYER 141

T1

T2

T3

T4

T5

WRITE VOLTAGE WAVEFORM
T1
T2
T3
T4
T5
T6
FOURTH MAGNETIZA-TION FREE LAYER 132
THIRD MAGNETIZA-TION FREE LAYER 131

FIG.22

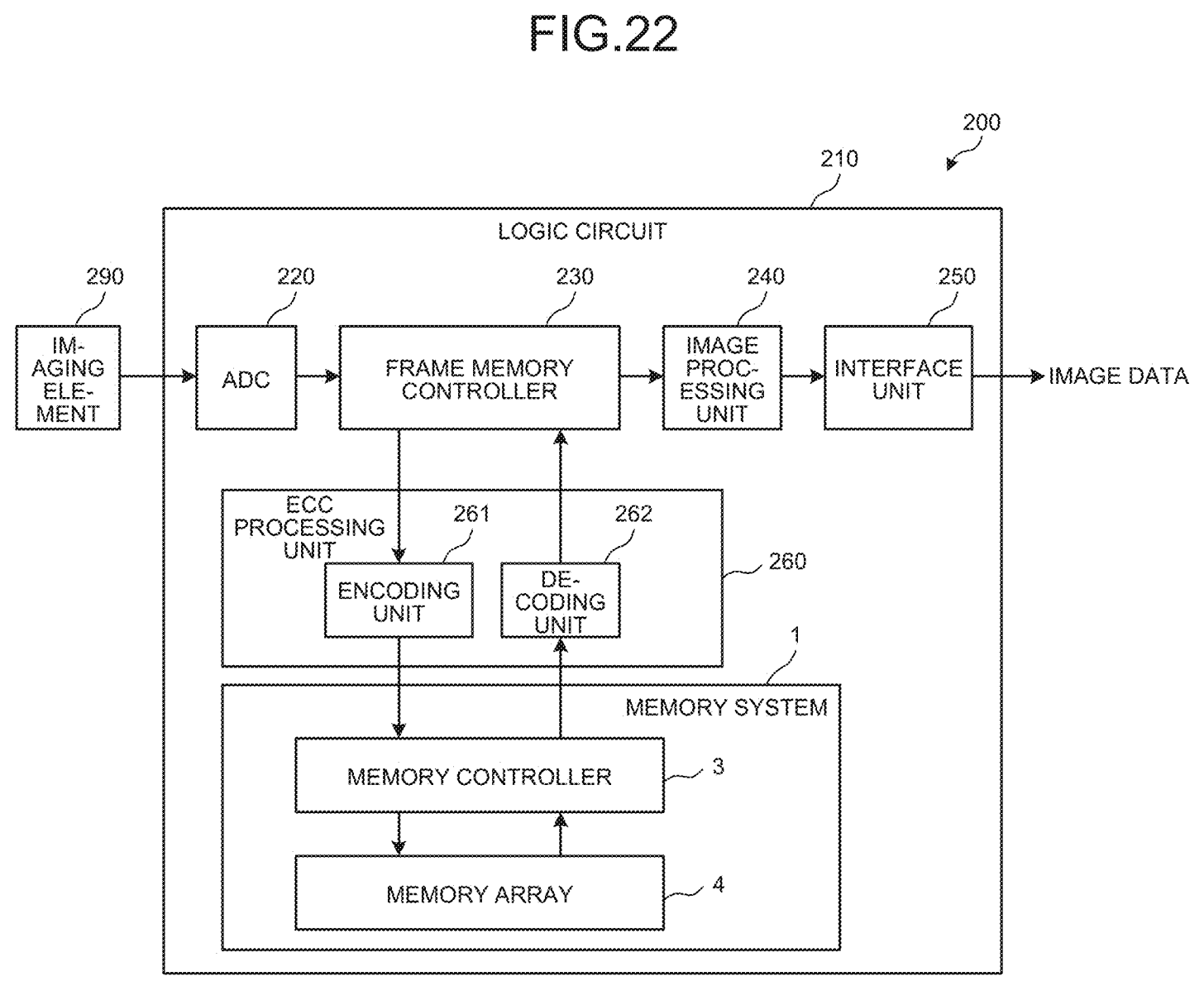

200
210
LOGIC CIRCUIT
290
IM-AGING ELE-MENT
220
ADC
230
FRAME MEMORY CONTROLLER
240
IMAGE PROC-ESSING UNIT
250
INTERFACE UNIT
IMAGE DATA
260
ECC PROCESSING UNIT
261
ENCODING UNIT
262
DE-CODING UNIT
1
MEMORY SYSTEM
3
MEMORY CONTROLLER
4
MEMORY ARRAY

FIG.24

MAGNETORESISTIVE EFFECT MEMORY, MEMORY ARRAY, AND MEMORY SYSTEM

CROSS REFERENCE TO RELATED APPLICATIONS

This application is a U.S. National Phase of International Patent Application No. PCT/JP2022/040609 filed on Oct. 31, 2022, which claims priority benefit of Japanese Patent Application No. JP 2021-186865 filed in the Japan Patent Office on Nov. 17, 2021. Each of the above-referenced applications is hereby incorporated herein by reference in its entirety.

FIELD

The present disclosure relates to magnetoresistive effect memory, and a memory array and a memory system using the magnetoresistive effect memory.

BACKGROUND

There is currently used memory referred to as magnetoresistive RAM (MRAM) that adopts a magnetic memory element as a nonvolatile storage element. The MRAM is a memory element that includes a magnetization fixed layer (may be generally referred to as a reference layer) in which a magnetization direction is fixed and a magnetization free layer (generally referred to as a storage layer in some cases) in which the magnetization direction is invertible, and on which data is written by inverting the magnetization direction of the magnetization free layer. Regarding MRAM, there has been proposed voltage-controlled MRAM on which data is written by application of a pulse voltage (refer to Patent Literature 1, for example).

The writing in the voltage-controlled MRAM of the known technology is performed using precession of a magnetization vector of the magnetization free layer caused by the application of a voltage. The writing can be performed by stopping the application of the voltage at a timing when the magnetization vector of the magnetization free layer is inverted in this precession.

CITATION LIST

Patent Literature

Patent Literature 1: JP 2018-092696 A

SUMMARY

Technical Problem

However, the above-described known technique has a problem that there is a need to precisely manage the pulse width of the voltage to be applied in order to improve the success rate of writing, leading to increased difficulty in writing.

In view of this, the present disclosure proposes magnetoresistive effect memory, a memory array, and a memory system that simplify writing.

Solution to Problem

Magnetoresistive effect memory according to the present disclosure includes: a magnetoresistive effect element, the magnetoresistive effect element including: a voltage-controlled magnetic anisotropy effect layer that is a magnetization free layer having a variable magnetization direction and has a voltage-controlled magnetic anisotropy effect; a non-voltage-controlled magnetic anisotropy effect layer that is a magnetization free layer having a variable magnetization direction and that has no voltage-controlled magnetic anisotropy effect; and a magnetization fixed layer having magnetic anisotropy and having an invariable magnetization direction.

BRIEF DESCRIPTION OF DRAWINGS

FIG. 4 is a diagram illustrating an example of a method of writing to a magnetoresistive effect element according to the first embodiment of the present disclosure.

FIG. 22 is a diagram illustrating a configuration example of an image processing system according to an application example of the embodiment of the present disclosure.

FIG. 24 is a diagram illustrating an example of a processing procedure of write processing of the image processing system according to the application example of the embodiment of the present disclosure.

DESCRIPTION OF EMBODIMENTS

Embodiments of the present disclosure will be described below in detail with reference to the drawings. The description will be given in the following order. Note that, in each of the following embodiments, the same parts are denoted by the same reference symbols, and a repetitive description thereof will be omitted.

1. First Embodiment
2. Second Embodiment
3. Modifications
4. Application examples

1. First Embodiment

[Configuration of Memory System]

Figure 1:
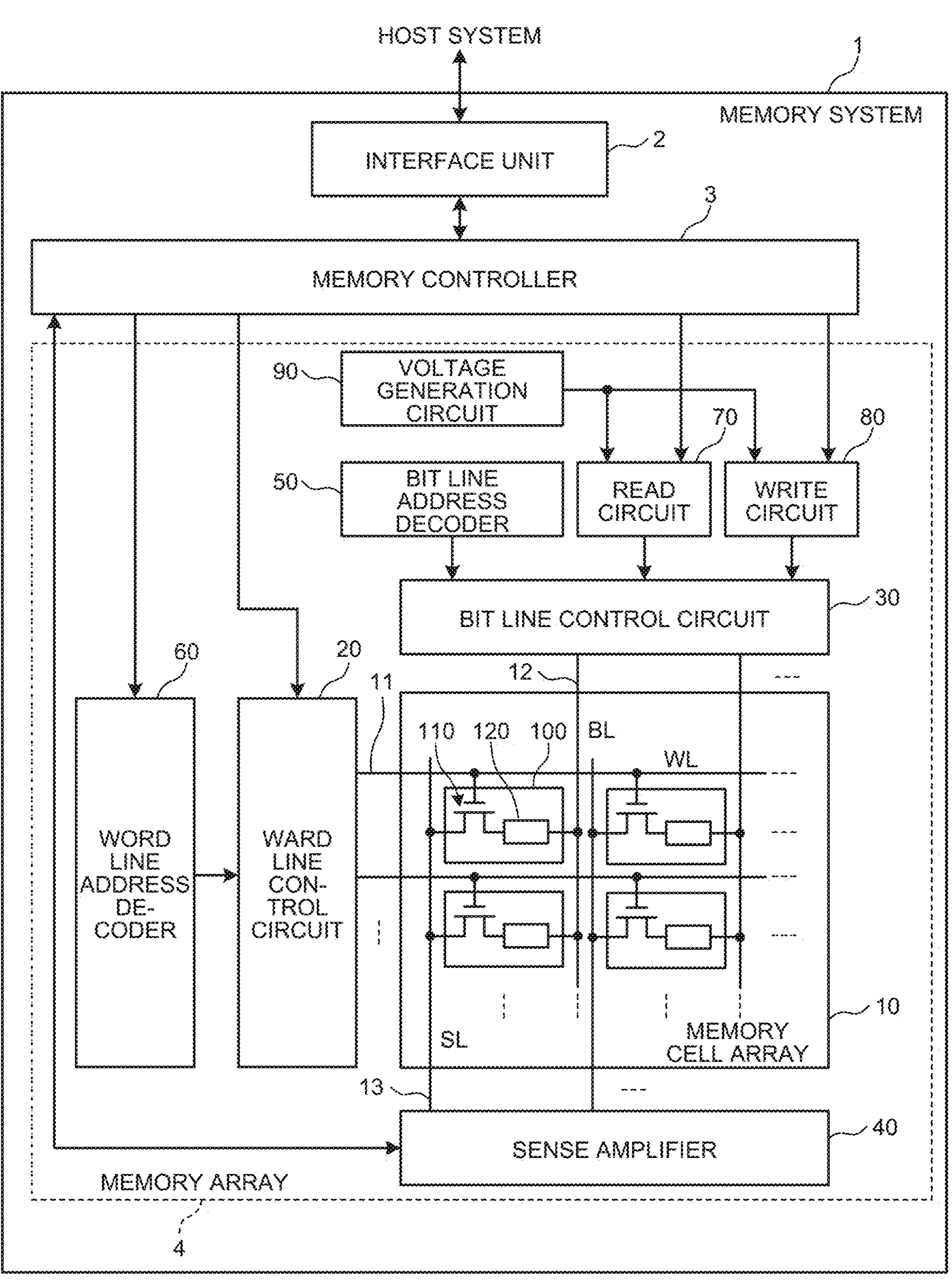
FIG. 1 is a diagram illustrating a configuration example of a memory system according to an embodiment of the present disclosure.

FIG. 1 is a diagram illustrating a configuration example of a memory system according to an embodiment of the present disclosure. The drawing is a block diagram illustrating a configuration example of a memory system 1. The memory system 1 includes an interface unit 2, a memory controller 3, and a memory array 4.

The interface unit 2 exchanges data with a host system or the like using the memory system 1.

The memory controller 3 exchanges data with the host system or the like. The memory controller 3 receives a command from the host system or the like, and controls data writing and data reading based on the received command. The memory controller 3 in the drawing outputs write and read commands and addresses, and write target data to the memory array 4. In addition, the memory controller 3 outputs a read command and thereafter receives read data from the memory array 4.

The memory array 4 includes a plurality of memory cells (memory cells 100 to be described below) and stores data. The memory array 4 includes a memory cell array 10, a word line address decoder 60, a word line control circuit 20, a bit line address decoder 50, a bit line control circuit 30, and a sense amplifier 40. The memory array 4 further includes a read circuit 70, a write circuit 80, and a voltage generation circuit 90.

The memory cell array 10 is constituted with a two-dimensional matrix including memory cells 100 storing data. The memory cell 100 includes a magnetoresistive effect element 120 and a selection element 110.

The magnetoresistive effect element 120 can be implemented by using a magnetoresistive effect element such as a magnetic tunnel junction (MTJ) element, for example. The MTJ element is an element in which a non-magnetic insulating layer is disposed between two ferromagnetic layers, and is an element in which a resistance value changes according to a magnetization direction of the two ferromagnetic layers. The MTJ element is in a high resistance state in a case where the magnetization directions of the two ferromagnetic layers are different, and is in a low resistance state in a case where the magnetization directions are the same. The state in which the magnetization directions are the same is referred to as a parallel state, while a state in which the magnetization directions are different is referred to as an anti-parallel state. The direction of the magnetization can be changed by applying a write voltage to the MTJ element. For example, it is possible to store 1-bit data by associating the values "0" and "1" with the low resistance state and the high resistance state of the MTJ element, respectively. The values "0" and "1" can also be referred to as a low level voltage (L) and a high level voltage (H), respectively.

The selection element 110 is an element that is connected to one end of the magnetoresistive effect element 120 and controls application of a voltage to the magnetoresistive effect element 120. The selection element 110 can be constituted with an n-channel MOS transistor, for example.

The memory cell 100 is connected to a word line (WL) and a bit line (BL) that transmit a control signal. For the memory cell 100, a source line (SL) that transmits a signal from the magnetoresistive effect element 120 is further disposed. The memory cell array 10 has a plurality of word lines disposed in the row direction, and a plurality of bit lines and source lines disposed in the column direction.

The word line address decoder 60 selects a word line of the memory cell array 10 based on a control signal from the memory controller 3.

The word line control circuit 20 outputs a control signal to the word line selected by the word line address decoder 60.

The bit line address decoder 50 selects a bit line of the memory cell array 10 based on a control signal from the memory controller 3.

The bit line control circuit 30 outputs a control signal to the bit line selected by the bit line address decoder 50.

The sense amplifier 40 detects a current flowing through the memory cell 100 at the time of reading, thereby reading data. The data that has been read is output to the memory controller 3. In addition, the sense amplifier 40 applies a write voltage to the memory cell 100 at the time of writing.

The read circuit 70 is a circuit that performs reading on the memory cell 100 at an intersection of the selected word line and bit line. The read circuit 70 performs reading on the magnetoresistive effect element 120 via the selection element 110 of the memory cell 100.

The write circuit 80 is a circuit that performs writing on the memory cell 100 at the intersection of the selected word line and bit line. The write circuit 80 performs writing on the magnetoresistive effect element 120 via the selection element 110 of the memory cell 100.

The voltage generation circuit 90 is a circuit that generates a voltage to be applied at the time of writing/reading to/from the memory cell 100.

Writing to the memory cell 100 is performed when the storage data of the memory cell 100 is different from the write data. That is, data is read from the memory cell 100, and the data that has been read is compared with the write data. Writing is performed when pieces of data are different as a result of the comparison. In this case, the writing can be performed by inverting the storage data of the memory cell 100. That is, writing can be performed by inverting the storage state of the magnetoresistive effect element 120. The inversion of the storage state of the magnetoresistive effect element 120 can be performed by applying a write voltage of a predetermined voltage to the magnetoresistive effect element 120. Details of writing in the magnetoresistive effect element 120 will be described below.

Reading can be performed by applying a predetermined read voltage to the magnetoresistive effect element 120 of the memory cell 100 and detecting a current flowing through the memory cell 100. The read voltage is preferably a voltage having a polarity different from the polarity of the write voltage.

[Memory Cell]

Figure 2:
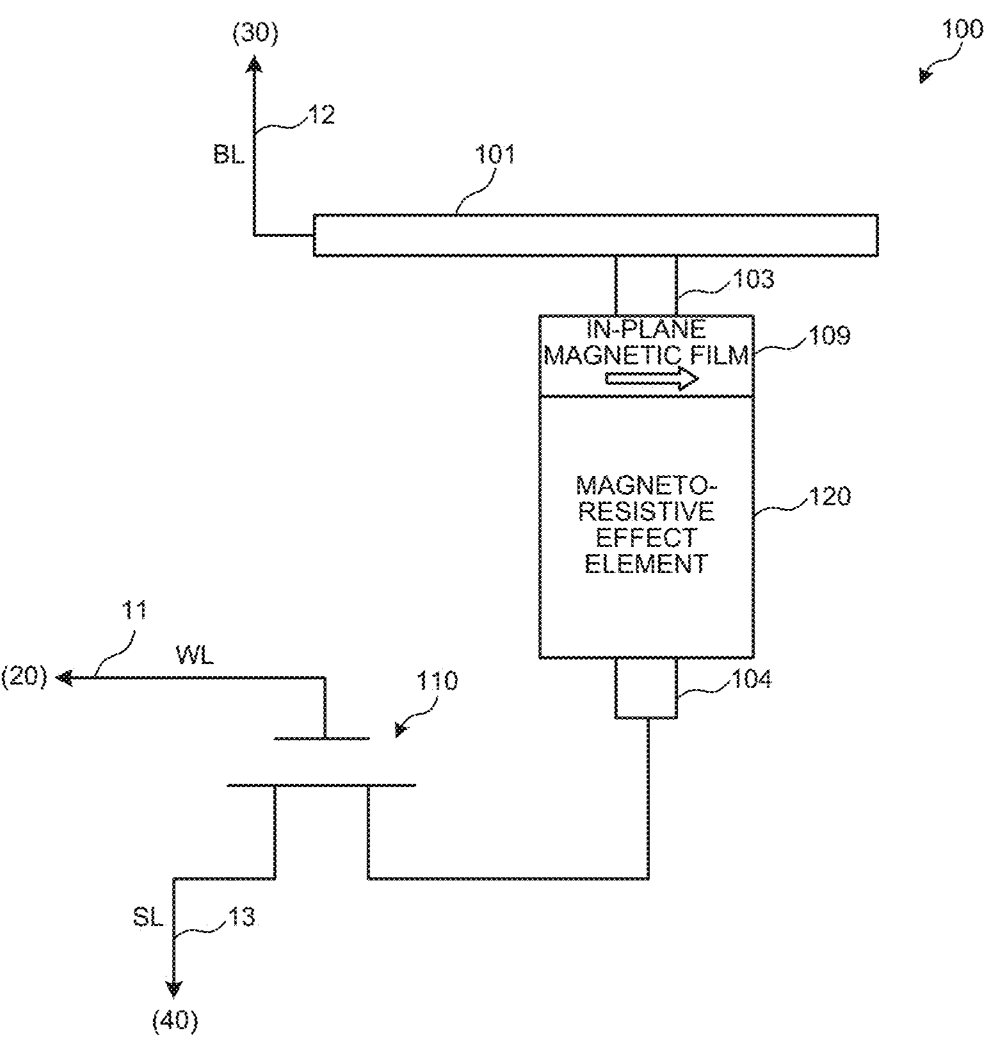
FIG. 2 is a diagram illustrating a configuration example of the memory cell according to the embodiment of the present disclosure.

FIG. 2 is a diagram illustrating a configuration example of the memory cell according to the embodiment of the present disclosure. The drawing is a schematic diagram illustrating a configuration example of the memory cell 100. As described above, the memory cell 100 includes the magnetoresistive effect element 120 and the selection element 110.

The magnetoresistive effect element 120 is connected to a wiring line 101 and the like via contact layers 103 and 104. As described below, the magnetoresistive effect element 120 is constituted with a stacked body in which a magnetization fixed layer 122, a first magnetization free layer 141, and the like are stacked. The configuration of the magnetoresistive effect element 120 will be described below.

The selection element 110 has its drain connected to the contact layer 104 of the magnetoresistive effect element 120, and has its source connected to the source line SL. The selection element 110 has its gate connected to the word line WL. The contact layer 103 on a reference layer 111 side of the magnetoresistive effect element 120 is connected to the wiring line 101 constituting the bit line BL. Application of an on-voltage to the word line WL brings the selection element 110 into a conducted state, making it possible to run a current corresponding to the applied voltage of the magnetoresistive effect element 120.

As described above, the word line WL is connected to the word line control circuit 20. The bit line BL is connected to the bit line control circuit 30. The source line SL is connected to the sense amplifier 40. By applying a voltage across the bit line BI and the source line SL and applying an on-voltage for conducting the selection element 110 to the word line WL, it is possible to apply a voltage for writing/reading to/from the magnetoresistive effect element 120.

In addition, there is provided an in-plane magnetic film 109 disposed on the magnetoresistive effect element 120 in the drawing. The in-plane magnetic film 109 applies a magnetic field in a direction (horizontal direction in the drawing) perpendicular to the stacking direction of the magnetization fixed layer 122 and the like of the magnetoresistive effect element 120.

The configuration of the memory cell 100 is not limited to this example. For example, either one of the contact layers 103 or 104 may be formed as an in-plane magnetic film. In this case, the in-plane magnetic film 109 can be omitted. In addition, a magnetic field can be applied using a leakage magnetic field by forming a magnet layer above or below the magnetoresistive effect element 120. It is also possible to insert an antiferromagnetic layer into the magnetoresistive effect element 120 to apply an exchange bias magnetic field from the antiferromagnetic layer. In addition, it is also possible to use a magnetic field generated by disposing a wiring line parallel to the horizontal direction of the magnetoresistive effect element 120 above the wiring line 101 or below the magnetoresistive effect element 120 and allowing a current to flow through the wiring line. In addition, it is also possible to adopt a method of disposing a permanent magnet around the memory array 4 to apply a magnetic field.

[Magnetoresistive Effect Element]

Figure 3:
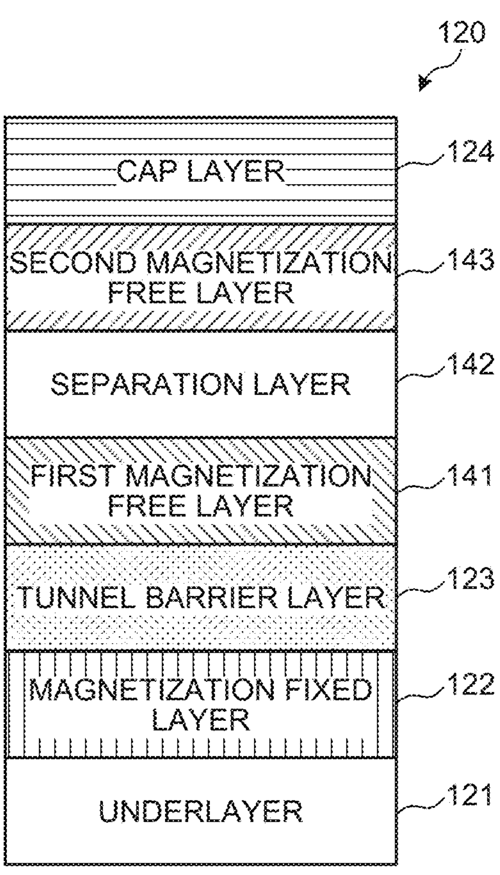
FIG. 3 is a diagram illustrating a configuration example of a magnetoresistive effect element according to a first embodiment of the present disclosure.

FIG. 3 is a diagram illustrating a configuration example of a magnetoresistive effect element according to a first embodiment of the present disclosure. The drawing is a cross-sectional view illustrating a configuration example of the magnetoresistive effect element 120. The magnetoresistive effect element 120 in the drawing includes an underlayer 121, a magnetization fixed layer 122, a tunnel barrier layer 123, a first magnetization free layer 141, a separation layer 142, a second magnetization free layer 143, and a cap layer 124. In addition, the magnetoresistive effect element 120 in the drawing is formed as a stacked body obtained by sequentially stacking the underlayer 121, the magnetization fixed layer 122, the tunnel barrier layer 123, the first magnetization free layer 141, the separation layer 142, the second magnetization free layer 143, and the cap layer 124. The separation layer may also be referred to as a spacer.

The underlayer 121 is a layer serving as a base of the magnetization fixed layer 122. The underlayer 121 can be formed of a metal such as Cr, Ta, Ru, Au, Ag, Cu, Al, Ti, V, Mo, Zr, Hf, Re, W, Pt, Pd, Ir, or Rh, or an alloy containing any of these metals. Further, the underlayer 121 can also be formed by stacking these substances. The underlayer 121 can also be formed of a conductive nitride such as TiN.

The magnetization fixed layer 122 is a layer having magnetic anisotropy and an invariable magnetization direction. The magnetization fixed layer 122 can be formed of materials such as CoFeB a, a CoFeC alloy, a NiFeB alloy, a NiFeC alloy, for example. Furthermore, the magnetization fixed layer 122 can have a stacked ferrimagnetic pinned layer structure in which a plurality of ferromagnetic layers is stacked via a non-magnetic layer. The ferromagnetic layer constituting the magnetization fixed layer having the stacked ferrimagnetic pinned layer structure may use a material such as Co, CoFe, or CoFeB. The non-magnetic layer may use a material such as Ru, Re, Ir, or Os.

Furthermore, the magnetization fixed layer 122 can have a configuration in which the magnetization direction is fixed by using antiferromagnetic coupling between the antiferromagnetic layer and the ferromagnetic layer. Examples of the material of the antiferromagnetic layer include magnetic materials such as FeMn alloy, PtMn alloy, PtCrMn alloy, NiMn alloy, IrMn alloy, NiO, and $Fe_2O_3$. In addition, it is also possible to add a non-magnetic element such as Ag, Cu, Au, Al, Si, Bi, Ta, B, C, O, N, Pd, Pt, Zr, Hf, Ir, W, Mo, or Nb to these magnetic materials.

The tunnel barrier layer 123 is disposed adjacent to the first magnetization free layer 141 to be described below, and applies an electric field to the first magnetization free layer 141 to impart a voltage-controlled magnetic anisotropy effect. In addition, the tunnel barrier layer 123 is a layer that separates the magnetization fixed layer 122 and the first magnetization free layer 141 from each other. The tunnel barrier layer 123 can be formed of an oxide of at least one element selected from the group consisting of Mg, Al, Ti, Si, Zn, Zr, Hf, Ta, Bi, Cr, Ga, La, Gd, Sr, and Ba, or can be formed of a nitride of at least one element selected from the group consisting of Mg, Al, Ti, Si, Zn, Zr, Hf, Ta, Bi, Cr, Ga, La, Gd, Sr, and Ba. In addition, the layer can also be formed by using an insulator such as $MgF_2$, CaF, $SrTiO_2$, $AlLaO_3$, or AlNO, or may be formed by using a dielectric and a semiconductor. The thickness of the tunnel barrier layer 123 is preferably 0.6 nm or more.

The first magnetization free layer 141 and the second magnetization free layer 143 are layers having magnetic anisotropy and a variable magnetization direction. A state in which the magnetization directions of the first magnetization free layer 141 and the second magnetization free layer 143 are the same as and different from the magnetization direction of the magnetization fixed layer 122 are referred to as a parallel state and an anti-parallel state, respectively. The magnetoresistive effect element 120 is in a low resistance state in the parallel state, and is in a high resistance state in the anti-parallel state. By applying a voltage to the magnetoresistive effect element 120 as described above, it is possible to invert the magnetization directions of the first magnetization free layer 141 and the second magnetization free layer 143.

The first magnetization free layer 141 is a layer having a voltage-controlled magnetic anisotropy (VCMA) effect. The second magnetization free layer 143 is a layer having no voltage-controlled magnetic anisotropy effect. When a voltage is applied to the first magnetization free layer 141 and the second magnetization free layer 143, the first magnetization free layer 141 with the voltage-controlled magnetic anisotropy effect will have small perpendicular magnetic anisotropy. In contrast, the second magnetic film with no voltage-controlled magnetic anisotropy effect will have a characteristic that the perpendicular magnetic anisotropy does not change even when a voltage is applied. The first magnetization free layer 141 is an example of a voltage-controlled magnetic anisotropy effect layer described in the claims. The second magnetization free layer 143 is an example of a non-voltage-controlled magnetic anisotropy effect layer described in the claims.

The separation layer 142 is a film that separates the first magnetization free layer 141 and the second magnetization free layer 143 from each other. The separation layer 142 separates the first magnetization free layer 141 and the second magnetization free layer 143 from each other while maintaining ferromagnetic coupling therebetween.

The first magnetization free layer 141 and the second magnetization free layer 143 can each be formed of cobalt iron (CoFe), cobalt iron boron (CoFeB), Fe, iron boride (FeB), or the like. In addition, it is also possible to adopt a configuration including a transition metal (Hf, Ta, W, Re, Ir, Pt, Au, Zr, Nb, Mo, Ru, Rh, Pd, Ag, Ti, V, Cr, Mn, Ni, Cu) or the like. In addition, a nitride or an oxide may be contained. In addition, iridium (Ir) or osmium (Os) can be used as a material that induces the proximity magnetic moment to the magnetic body. A heavy metal can be added to the first magnetization free layer 141 to improve the voltage-controlled magnetic anisotropy effect. The thicknesses of the first magnetization free layer 141 and the second magnetization free layer 143 are preferably 3.0 nm or less.

The separation layer 142 can be formed of a material such as Mg, Al, Ti, Si, Zn, Zr, Hf, Ta, Bi, Cr, Ga, La, Gd, Sr, Ba, W, Re, Ir, Pt, Au, Nb, Mo, Ru, Rh, Pd, Ag, V, Mn, Ni, or Cu.

The cap layer 124 is a layer that prevents diffusion of metal from the wiring member. The cap layer 124 can be formed of a metal such as Cr, Ta, Ru, Au, Ag, Cu, Al, Ti, V, Mo, Zr, Hf, Re, W, Pt, Pd, Ir, or Rh. The cap layer 124 can be formed by a layer including an alloy or a transition metal element containing these elements. The cap layer 124 can also be formed by stacking these substances. The cap layer 124 can also be formed of a conductive nitride such as TiN.

[Writing]

FIG. 4 is a diagram illustrating an example of a method of writing to a magnetoresistive effect element according to the first embodiment of the present disclosure. This drawing is a diagram illustrating writing to the magnetoresistive effect element 120. The drawing illustrates, on the upper side, a write voltage waveform of the magnetoresistive effect element 120. The broken line of this waveform represents the level of 0 V. In addition, the drawing illustrates, on the lower side, states of the magnetization energy of the first magnetization free layer 141 and the second magnetization free layer 143 in the process of applying the write voltage. When the write voltage is applied, a magnetic field in a direction perpendicular to the stacking direction of the magnetization fixed layer 122, the first magnetization free layer 141, and the second magnetization free layer 143 is applied.

T1 represents a state before the write voltage is applied. In this state, both the first magnetization free layer 141 and the second magnetization free layer 143 indicate a magnetization energy curve in an upward protruding shape. Note that an open circle in the drawing represents a direction in which the magnetization vector is directed. When the direction of the magnetization vector shifts to the opposite side beyond the peak (barrier) of the magnetization energy curve, the direction of magnetization is inverted. In addition, the magnetization vector of the first magnetization free layer 141 and the direction of the vector of the second magnetization free layer 143 are in a ferromagnetic coupling state. The dotted line connecting the open circles in the drawing represents the ferromagnetic coupling.

T2 represents a state immediately after the write voltage is applied. The magnetization energy curve of the first magnetization free layer 141 is inverted into a downward protruding shape. This causes the magnetization vector of the first magnetization free layer 141 to start precession in the direction of the magnetic field. The dotted curve in the drawing represents the locus of precession. When the magnetization vector of the first magnetization free layer 141 starts precession, the magnetization vector of the second magnetization free layer 143 that is in ferromagnetic coupling follows the movement and starts inversion.

At T3, the magnetization vector of the second magnetization free layer 143 crosses the barrier and transitions to a low energy state, so as to be in an inverted state. In the following T4 and T5, the rotation due to the precession of the first magnetization free layer 141 is suppressed by the ferromagnetic coupling of the first magnetization free layer 141 and the second magnetization free layer 143. Therefore, the direction of the magnetization vector of the first magnetization free layer 141 is converged to a low energy state. That is, the direction of the magnetization vector of the first magnetization free layer 141 stops at a state not crossing the valley of the magnetization energy curve.

At T5, the application of the write voltage is stopped, and the magnetization energy curve of the first magnetization free layer 141 is inverted to return to the state of T1. As illustrated in the drawing, the magnetization vector of the first magnetization free layer 141 and the magnetization vector of the second magnetization free layer 143 can be inverted. The above operation also depends on the damping constant and the magnitude of the coupling energy of the first magnetization free layer 141 and the second magnetization free layer 143.

In this manner, the magnetization vector of the second magnetization free layer 143 in the ferromagnetic coupling state can prevent re-inversion due to the precession of the magnetization vector of the first magnetization free layer 141.

Figure 5A:
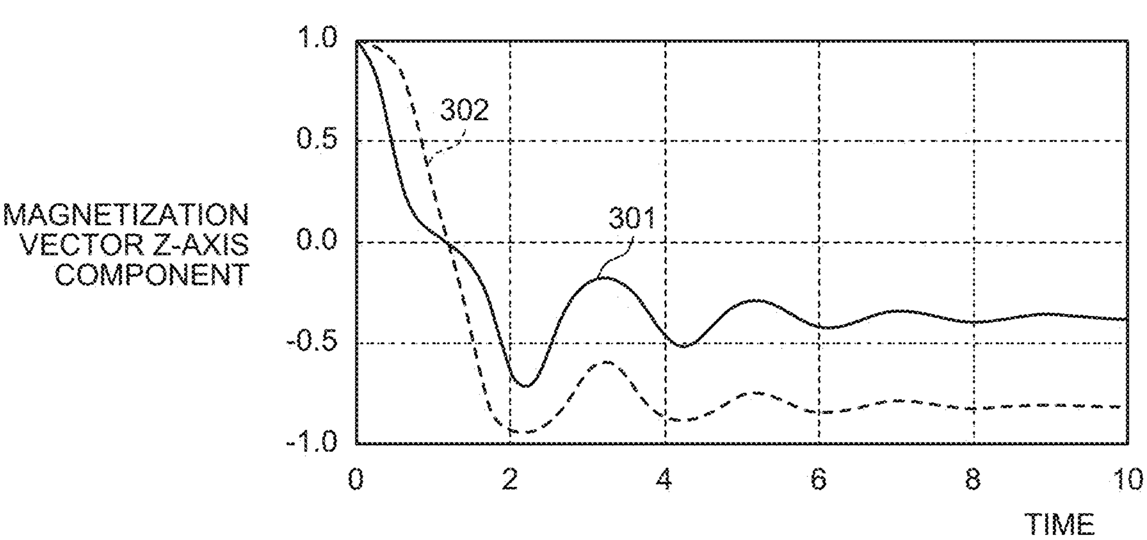
FIG. 5A is a diagram illustrating an example of writing to the magnetoresistive effect element according to the first embodiment of the present disclosure.
Figure 5B:
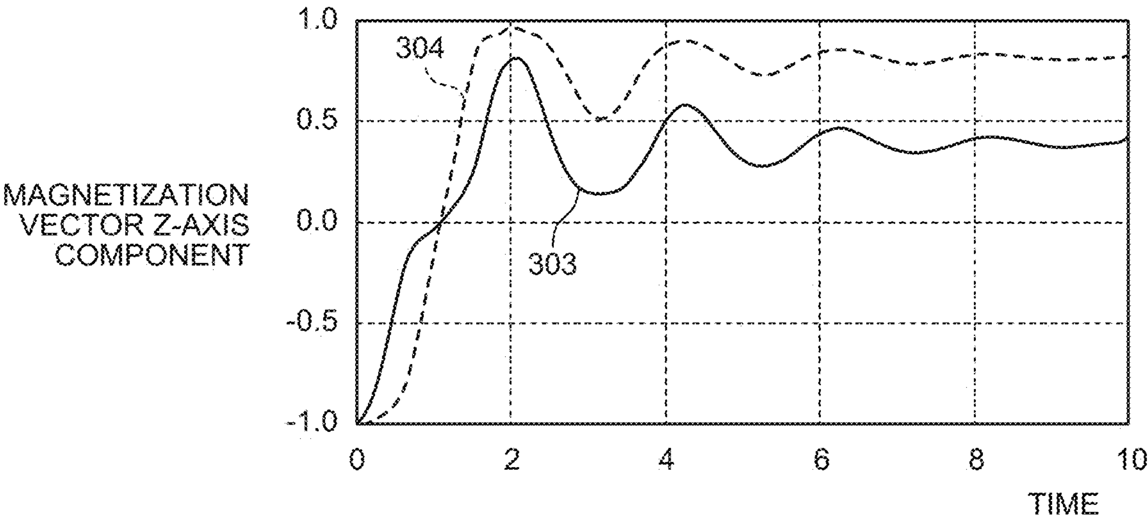
FIG. 5B is a diagram illustrating an example of writing to the magnetoresistive effect element according to the first embodiment of the present disclosure.

FIGS. 5A and 5B are diagrams illustrating an example of writing to the magnetoresistive effect element according to the first embodiment of the present disclosure. This drawing is a diagram illustrating a result of the writing to the magnetoresistive effect element 120. FIGS. 5A and 5B have a difference in the directions of magnetization vectors in an initial state. The vertical axis in the drawing represents a Z-axis component which is a direction of a magnetization vector. The horizontal axis in the drawing represents the elapsed time from the application of the write voltage. The elapsed time is described in a unit of ns. In addition, a solid curve 301 and a dotted curve 302 in FIG. 5A represent the Z-axis component of the magnetization vector of the first magnetization free layer 141 and the Z-axis component of the magnetization vector of the second magnetization free layer 143, respectively. In addition, a solid curve 303 and a dotted curve 304 in FIG. 5B similarly represent the Z-axis component of the magnetization vector of the first magnetization free layer 141 and the Z-axis component of the magnetization vector of the second magnetization free layer 143, respectively.

In FIG. 5A, with the application of the write voltage, the magnetization vector of the first magnetization free layer 141 starts inversion, and then, the magnetization vector of the second magnetization free layer 143 in ferromagnetic coupling follows and starts inversion. Thereafter, the magnetization vector of the second magnetization free layer 143 is inverted. Subsequently, the magnetization vector of the first magnetization free layer 141 is inverted following the magnetization vector of the second magnetization free layer 143 and stops in an inverted state.

Also in FIG. 5B, with the application of the write voltage, the magnetization vector of the first magnetization free layer 141 starts inversion, and then, the magnetization vector of the second magnetization free layer 143 follows and starts inversion. Thereafter, when the magnetization vector of the second magnetization free layer 143 is inverted, the magnetization vector of the first magnetization free layer 141 is inverted following the magnetization vector of the second magnetization free layer 143 and stops in an inverted state.

In either case of FIGS. 5A and 5B, the directions of the magnetization vectors of the first magnetization free layer 141 and the second magnetization free layer 143 can be inverted by setting the pulse width of the write voltage to 2 ns or more, for example. This eliminates the necessity to precisely manage the pulse width of the write voltage, achieving simplification of writing.

[Write Processing]

Figure 6:
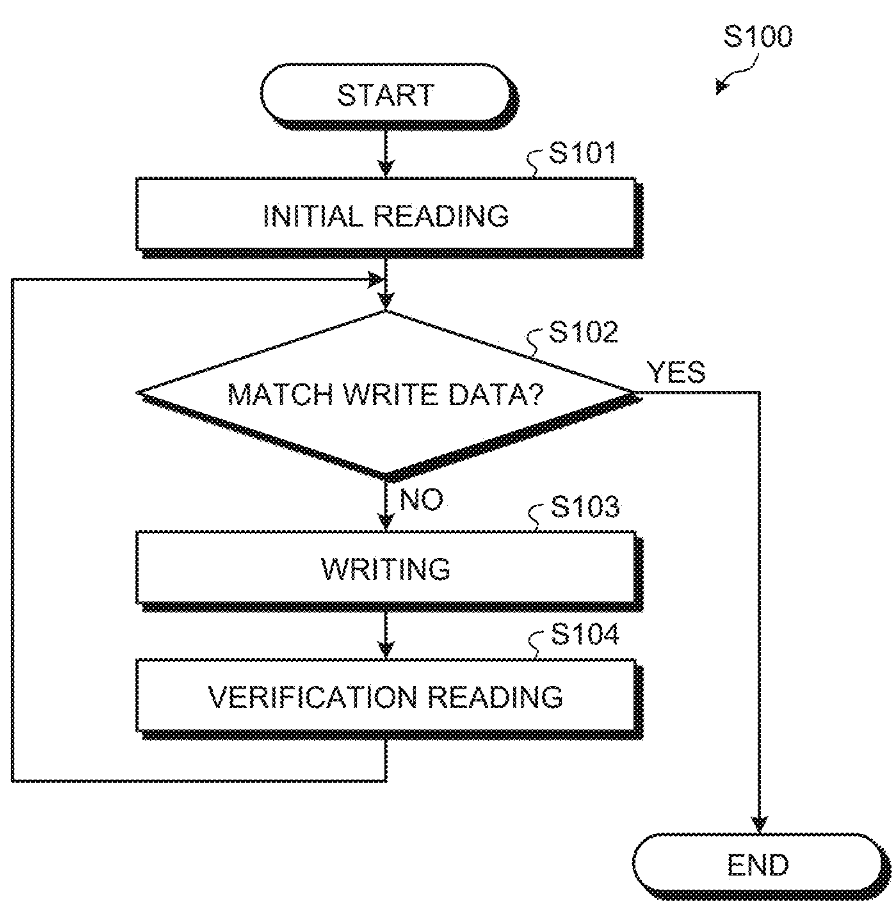
FIG. 6 is a diagram illustrating an example of a processing procedure of write processing according to the embodiment of the present disclosure.

FIG. 6 is a diagram illustrating an example of a processing procedure of write processing according to the embodiment of the present disclosure. The drawing is a flowchart illustrating an example of write processing (Step S100) in the memory system 1. First, the read circuit 7 performs initial reading from the target memory cell 100 (Step S101). Next, it is determined whether the data read by the memory controller 3 matches the write data (Step S102). When the data matches the write data as a result of determination (Step S102, Yes), the processing ends.

In contrast, in Step S102, when the data does not match the write data (Step S102, No), the write circuit 80 performs writing (Step S103). Next, the read circuit 7 performs reading (Step S104). Thereafter, the processing from Step S102 is performed again. The above processing achieves the writing.

Modifications

Next, a modification of the first embodiment described above will be described.

[Configuration of Magnetoresistive Effect Element]

FIGS. 7 to 10 are diagrams illustrating a configuration example of a magnetoresistive effect element according to a modification of the first embodiment of the present disclosure. Similarly to FIG. 3, FIGS. 7 to 10 are cross-sectional views illustrating a configuration example of the magnetoresistive effect element 120.

Figure 7:
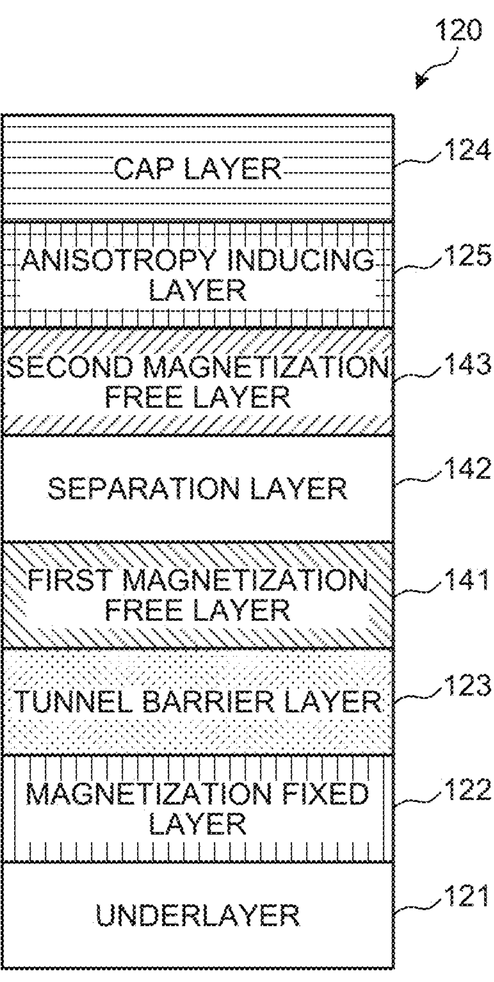
FIG. 7 is a diagram illustrating a configuration example of a magnetoresistive effect element according to a modification of the first embodiment of the present disclosure.

The magnetoresistive effect element 120 of FIG. 7 is different from the magnetoresistive effect element 120 of FIG. 3 in further including an anisotropy inducing layer 125. The anisotropy inducing layer 125 is a layer that induces magnetic anisotropy. The anisotropy inducing layer 125 can be formed of a member similar to the member used in the tunnel barrier layer 123. The anisotropy inducing layer 125 may be disposed between the cap layer 124 and the first magnetization free layer 141 or between the cap layer 124 and the second magnetization free layer 143.

Figure 8:
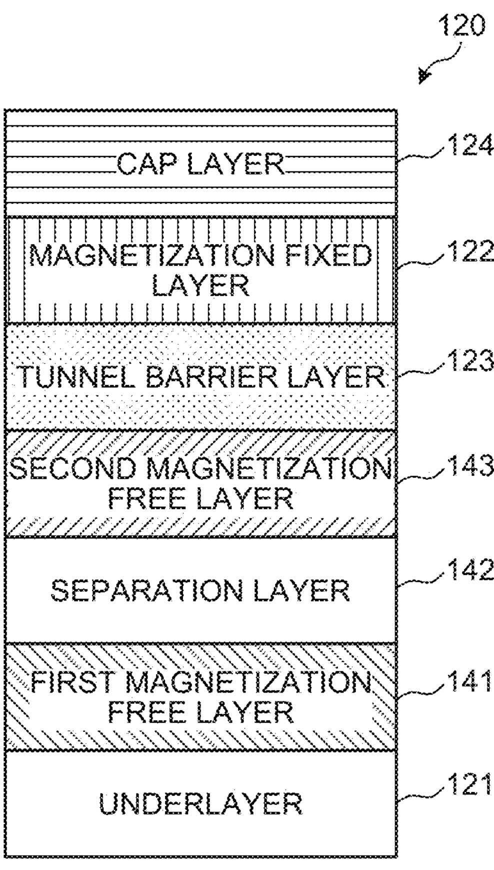
FIG. 8 is a diagram illustrating a configuration example of a magnetoresistive effect element according to a modification of the first embodiment of the present disclosure.

The magnetoresistive effect element 120 of FIG. 8 represents an example in which the positions of the magnetization fixed layer 122, the first magnetization free layer 141, and the second magnetization free layer 143 of the magnetoresistive effect element 120 of FIG. 3 are interchanged.

Figure 9:
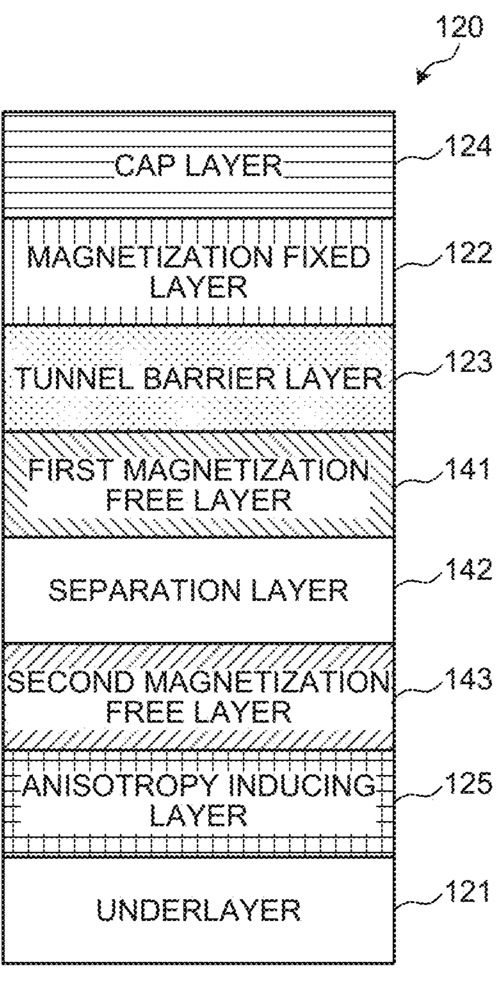
FIG. 9 is a diagram illustrating a configuration example of a magnetoresistive effect element according to a modification of the first embodiment of the present disclosure.

The magnetoresistive effect element 120 of FIG. 9 illustrates an example in which the anisotropy inducing layer 125 is added to the magnetoresistive effect element 120 of FIG. 8. The anisotropy inducing layer 125 may be disposed between the underlayer 121 and the first magnetization free layer 141/the second magnetization free layer 143.

Figure 10:
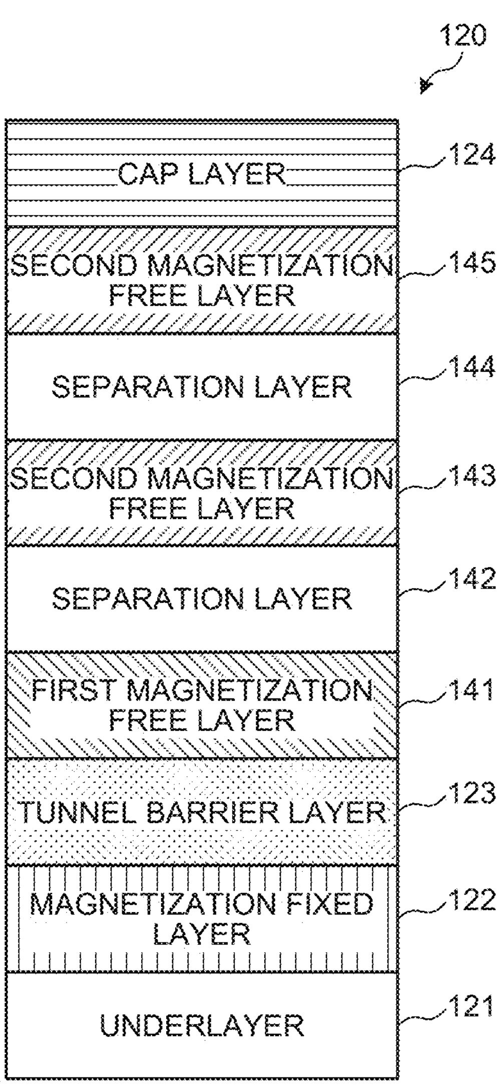
FIG. 10 is a diagram illustrating a configuration example of a magnetoresistive effect element according to a modification of the first embodiment of the present disclosure.

The magnetoresistive effect element 120 of FIG. 10 illustrates an example in which the magnetoresistive effect element 120 of FIG. 3 further includes a second magnetization free layer 145 and a separation layer 144. The first magnetization free layer 141, the separation layer 142, the second magnetization free layer 143, the separation layer 144, and the second magnetization free layer 145 are stacked in this order. The second magnetization free layer 145 is an example of a non-voltage-controlled magnetic anisotropy effect layer described in the claims.

In this manner, the magnetoresistive effect element 120 of the first embodiment of the present disclosure includes the first magnetization free layer 141 with the voltage-controlled magnetic anisotropy effect and the second magnetization free layer 143 with no voltage-controlled magnetic anisotropy effect. This makes it possible to simplify writing to the memory cell 100 using the magnetoresistive effect element 120.

2. Second Embodiment

The magnetoresistive effect element 120 of the first embodiment described above includes the first magnetization free layer 141 with the voltage-controlled magnetic anisotropy effect and the second magnetization free layer 143 with no voltage-controlled magnetic anisotropy effect. In contrast, a magnetoresistive effect element 120 of a second embodiment of the present disclosure is different from the case of the above-described first embodiment in that the element includes a plurality of magnetization free layers with the voltage-controlled magnetic anisotropy effect.

[Magnetoresistive Effect Element]

Figure 11:
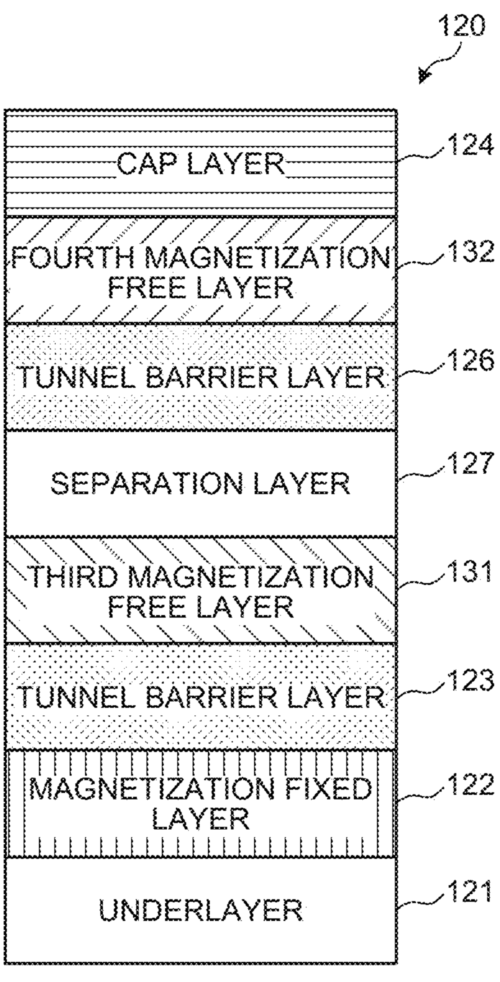
FIG. 11 is a diagram illustrating a configuration example of a magnetoresistive effect element according to a modification of a second embodiment of the present disclosure.

FIG. 11 is a diagram illustrating a configuration example of a magnetoresistive effect element according to the second embodiment of the present disclosure. Similarly to FIG. 3, the drawing is a cross-sectional view illustrating a configuration example of the magnetoresistive effect element 120. The magnetoresistive effect element 120 in the drawing includes an underlayer 121, a tunnel barrier layer 123, a third magnetization free layer 131, a separation layer 127, a tunnel barrier layer 126, a fourth magnetization free layer 132, and a cap layer 124.

The third magnetization free layer 131 and the fourth magnetization free layer 132 are magnetization free layers having variable magnetization directions. Similarly to the first magnetization free layer 141, the third magnetization free layer 131 and the fourth magnetization free layer 132 are layers having the voltage-controlled magnetic anisotropy effect.

The third magnetization free layer 131 is a layer that loses perpendicular magnetic anisotropy when a predetermined write voltage is applied at the time of writing. In contrast, the fourth magnetization free layer 132 is a layer that maintains perpendicular magnetic anisotropy even when a predetermined write voltage is applied at the time of writing.

The tunnel barrier layer 123 in the drawing is disposed adjacent to the third magnetization free layer 131. The tunnel barrier layer 126 is disposed adjacent to the fourth magnetization free layer 132. In addition, the separation layer 127 is disposed between the third magnetization free layer 131 and the fourth magnetization free layer 132.

The third magnetization free layer 131 and the fourth magnetization free layer 132 can each be formed of cobalt iron (CoFe), cobalt iron boron (CoFeB), Fe, iron boride (FeB), or the like. In addition, it is also possible to adopt a configuration including a transition metal (Hf, Ta, W, Re, Ir, Pt, Au, Zr, Nb, Mo, Ru, Rh, Pd, Ag, Ti, V, Cr, Mn, Ni, Cu) or the like. In addition, a nitride or an oxide may be contained. In addition, iridium (Ir) or osmium (Os) can be used as a material that induces the proximity magnetic moment to the magnetic body. A heavy metal can be added to the third magnetization free layer 131 to improve the voltage-controlled magnetic anisotropy effect. The thicknesses of the third magnetization free layer 131 and the fourth magnetization free layer 132 are preferably 3.0 nm or less.

The separation layer 127 can be formed of a material such as Mg, Al, Ti, Si, Zn, Zr, Hf, Ta, Bi, Cr, Ga, La, Gd, Sr, Ba, W, Re, Ir, Pt, Au, Nb, Mo, Ru, Rh, Pd, Ag, V, Mn, Ni, or Cu,

[Writing]

Figure 12:
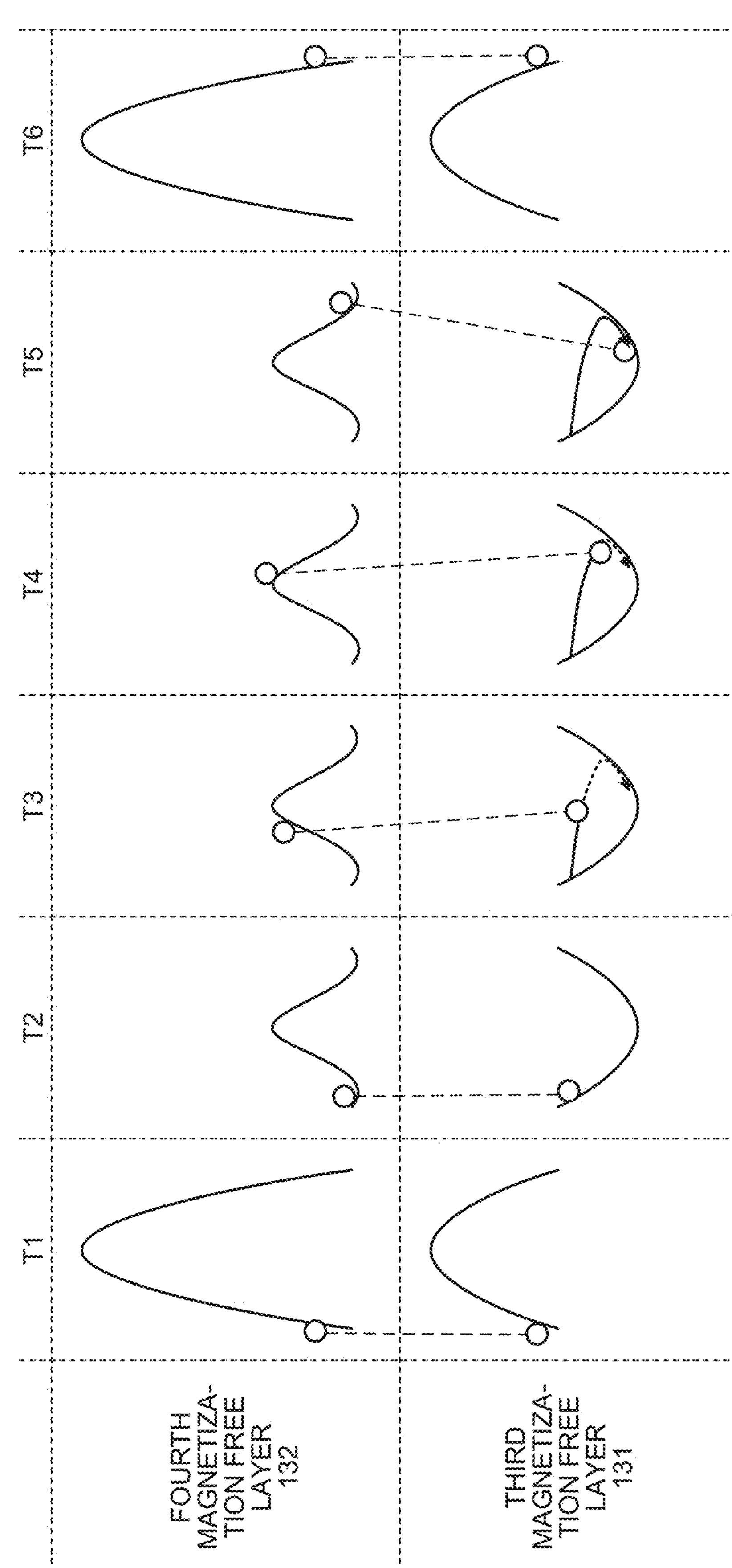
FIG. 12 is a diagram illustrating an example of a method of writing to a magnetoresistive effect element according to the second embodiment of the present disclosure.

FIG. 12 is a diagram illustrating an example of a method of writing to a magnetoresistive effect element according to the second embodiment of the present disclosure. Similarly to FIG. 4, the drawing is a diagram illustrating writing to the magnetoresistive effect element 120. The drawing illustrates, on the upper side, a write voltage waveform of the magnetoresistive effect element 120. In addition, the drawing illustrates, on the lower side, states of the magnetization energy of the third magnetization free layer 131 and the fourth magnetization free layer 132 in the process of applying the write voltage. Other than these, notations similar to those in FIG. 4 are used.

T1 represents a state before the write voltage is applied. The third magnetization free layer 131 and the fourth magnetization free layer 132 indicate both magnetization energy curves having an upward protruding shape. The magnetization vector of the third magnetization free layer 131 and the direction of the vector of the fourth magnetization free layer 132 are in a ferromagnetic coupling state.

T2 represents a state immediately after the write voltage is applied. The magnetization energy curve of the third magnetization free layer 131 is inverted into a downward protruding shape. That is, the third magnetization free layer 131 has lost the perpendicular magnetic anisotropy. In contrast, the fourth magnetization free layer 132 maintains an upward protruding shape even though the height of the magnetization energy curve is lowered. That is, the fourth magnetization free layer 132 maintains perpendicular magnetic anisotropy.

At T3, the magnetization vector of the third magnetization free layer 131 performs a precession movement in the direction of the magnetic field. The magnetization vector of the fourth magnetization free layer 132 that is in ferromagnetic coupling with the third magnetization free layer 131 follows the movement and starts inversion.

At T4, the magnetization vector of the fourth magnetization free layer 132 crosses the barrier so as to be in an inverted state. In the following T5, the rotation due to the precession of the third magnetization free layer 131 is suppressed by the ferromagnetic coupling of the third magnetization free layer 131 and the fourth magnetization free layer 132. Therefore, the direction of the magnetization vector of the third magnetization free layer 131 stops in a state not crossing the valley of the magnetization energy curve.

At T6, the application of the write voltage is stopped, and the magnetization energy curve of the third magnetization free layer 131 is inverted to return to the state of T1. As illustrated in the drawing, the magnetization vector of the third magnetization free layer 131 and the magnetization vector of the fourth magnetization free layer 132 can be inverted.

In this manner, the magnetization vector of the fourth magnetization free layer 132 in the ferromagnetic coupling state can prevent re-inversion due to the precession of the magnetization vector of the third magnetization free layer 131.

[Perpendicular Magnetic Anisotropy]

Figure 13:
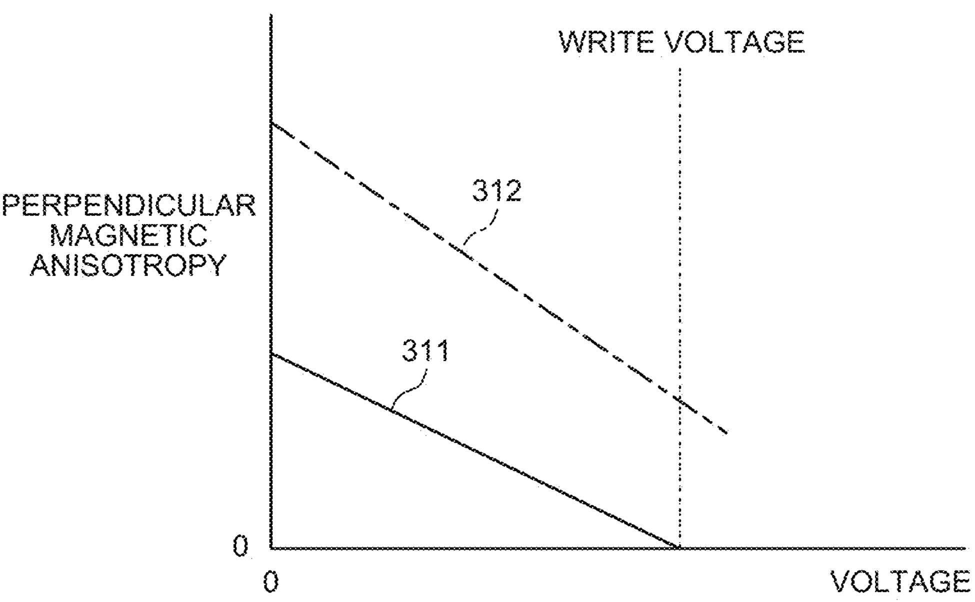
FIG. 13 is a diagram illustrating an example of perpendicular magnetic anisotropy of a magnetization free layer according to the second embodiment of the present disclosure.

FIG. 13 is a diagram illustrating an example of perpendicular magnetic anisotropy of a magnetization free layer according to the second embodiment of the present disclosure. The drawing is a diagram illustrating a change in the perpendicular magnetic anisotropy according to the applied voltage in the third magnetization free layer 131 and the fourth magnetization free layer 132. The vertical axis in the drawing represents perpendicular magnetic anisotropy. In addition, the horizontal axis in the drawing represents an applied voltage. A solid line graph 311 in the drawing represents a change in the perpendicular magnetic anisotropy of the third magnetization free layer 131. A one-dot chain line graph 312 in the drawing represents a change in the perpendicular magnetic anisotropy of the fourth magnetization free layer 132. In addition, a dotted line in the drawing represents a write voltage.

As illustrated in the drawing, application of a voltage decreases the perpendicular magnetic anisotropy of the third magnetization free layer 131 and the fourth magnetization free layer 132. Regarding the third magnetization free layer 131, the perpendicular magnetic anisotropy of indicates the value "0" when the applied voltage reaches the write voltage. On the other hand, regarding the fourth magnetization free layer 132, the perpendicular magnetic anisotropy is maintained even when the applied voltage reaches the write voltage. By utilizing this property, it is possible to obtain an effect similar to the case of the magnetoresistive effect element 120 in FIG. 3.

Modifications

Next, a modification of the first embodiment described above will be described.

[Configuration of Magnetoresistive Effect Element]

FIGS. 14 to 19 are diagrams illustrating configuration examples of a magnetoresistive effect element according to modifications of the second embodiment of the present disclosure. Similarly to FIG. 3, FIGS. 7 to 10 are cross-sectional views illustrating a configuration example of the magnetoresistive effect element 120.

Figure 14:
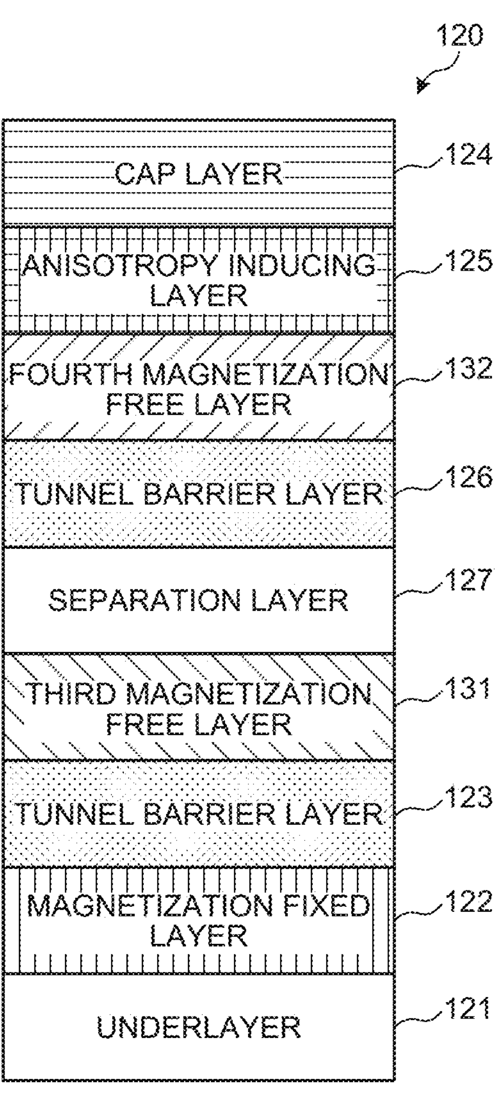
FIG. 14 is a diagram illustrating a configuration example of a magnetoresistive effect element according to a modification of the second embodiment of the present disclosure.

The magnetoresistive effect element 120 in FIG. 14 illustrates an example in which the anisotropy inducing layer 125 is added to the magnetoresistive effect element 120 in FIG. 11.

Figure 15:
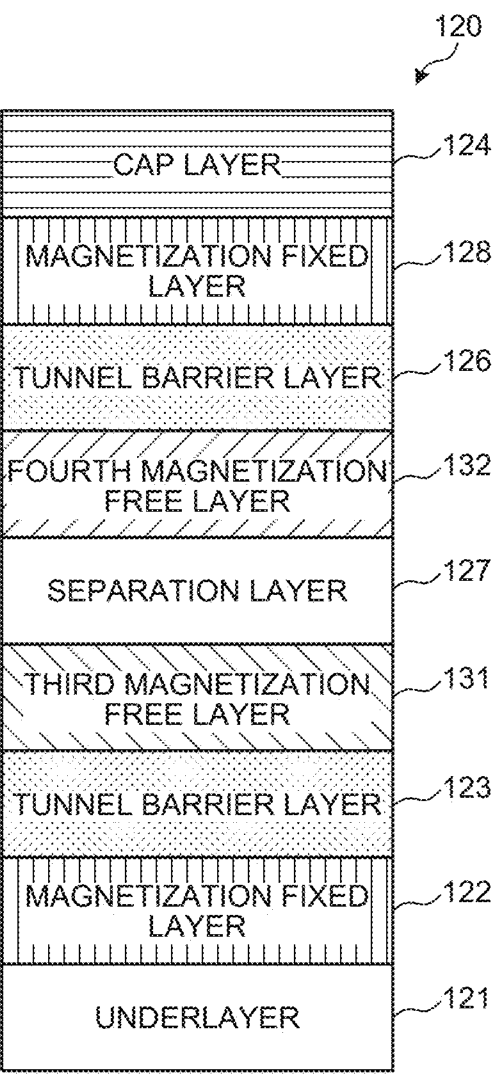
FIG. 15 is a diagram illustrating a configuration example of a magnetoresistive effect element according to a modification of the second embodiment of the present disclosure.

The magnetoresistive effect element 120 of FIG. 15 illustrates an example in which a magnetization fixed layer 128 is added to the magnetoresistive effect element 120 of FIG. 11. The magnetoresistive effect element 120 in the drawing is obtained by interchanging the positions of the tunnel barrier layer 126 and the fourth magnetization free layer 132 in the magnetoresistive effect element 120 in FIG. 11. The magnetization fixed layer 128 is disposed between the tunnel barrier layer 126 and the cap layer 124.

Figure 16:
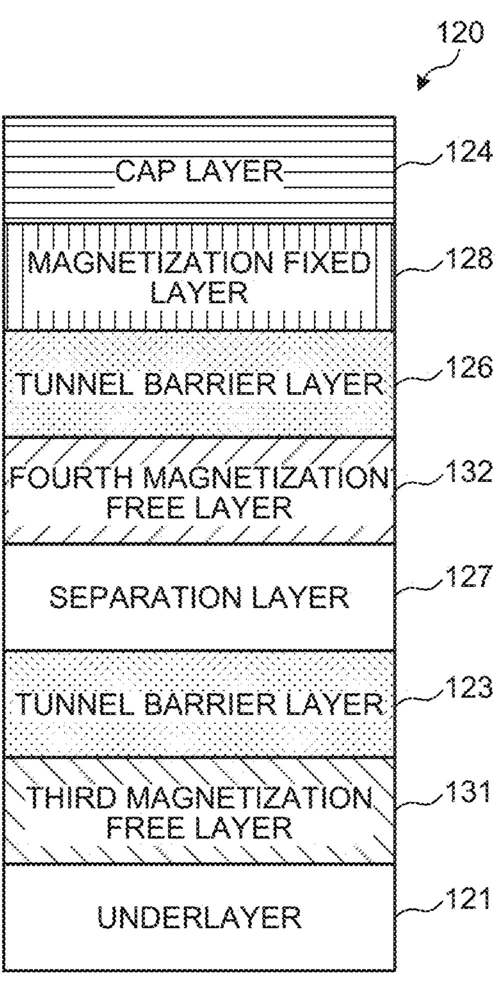
FIG. 16 is a diagram illustrating a configuration example of a magnetoresistive effect element according to a modification of the second embodiment of the present disclosure.

The magnetoresistive effect element 120 of FIG. 16 illustrates an example obtained by changing the position of the magnetization fixed layer 128 of the magnetoresistive effect element 120 of FIG. 11.

Figure 17:
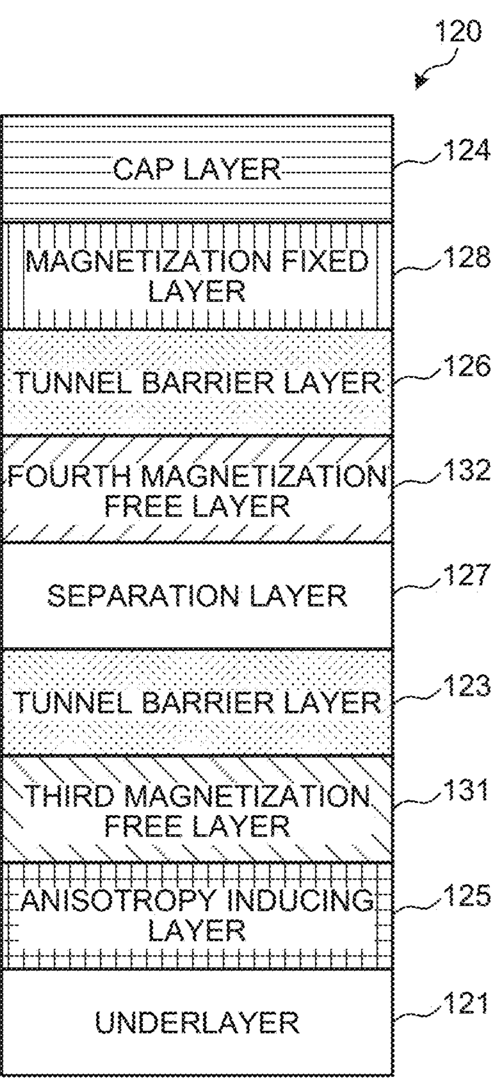
FIG. 17 is a diagram illustrating a configuration example of a magnetoresistive effect element according to a modification of the second embodiment of the present disclosure.

The magnetoresistive effect element 120 in FIG. 17 illustrates an example in which the anisotropy inducing layer 125 is added to the magnetoresistive effect element 120 in FIG. 16. The anisotropy inducing layer 125 can be disposed between the underlayer 121 and the third magnetization free layer 131.

Figure 18:
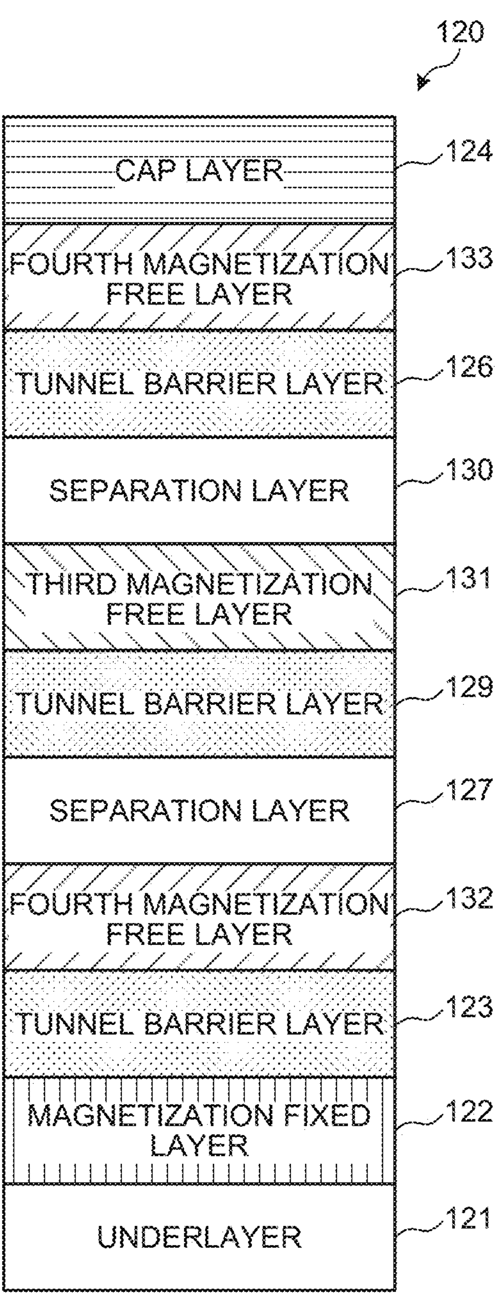
FIG. 18 is a diagram illustrating a configuration example of a magnetoresistive effect element according to a modification of the second embodiment of the present disclosure.

The magnetoresistive effect element 120 of FIG. 18 illustrates an example in which a separation layer 130, a tunnel barrier layer 126, and a fourth magnetization free layer 133 are added to the magnetoresistive effect element 120 of FIG. 11. The separation layer 130, the tunnel barrier layer 126, and the fourth magnetization free layer 133 are stacked in this order and disposed between the third magnetization free layer 131 and the cap layer 124.

Figure 19:
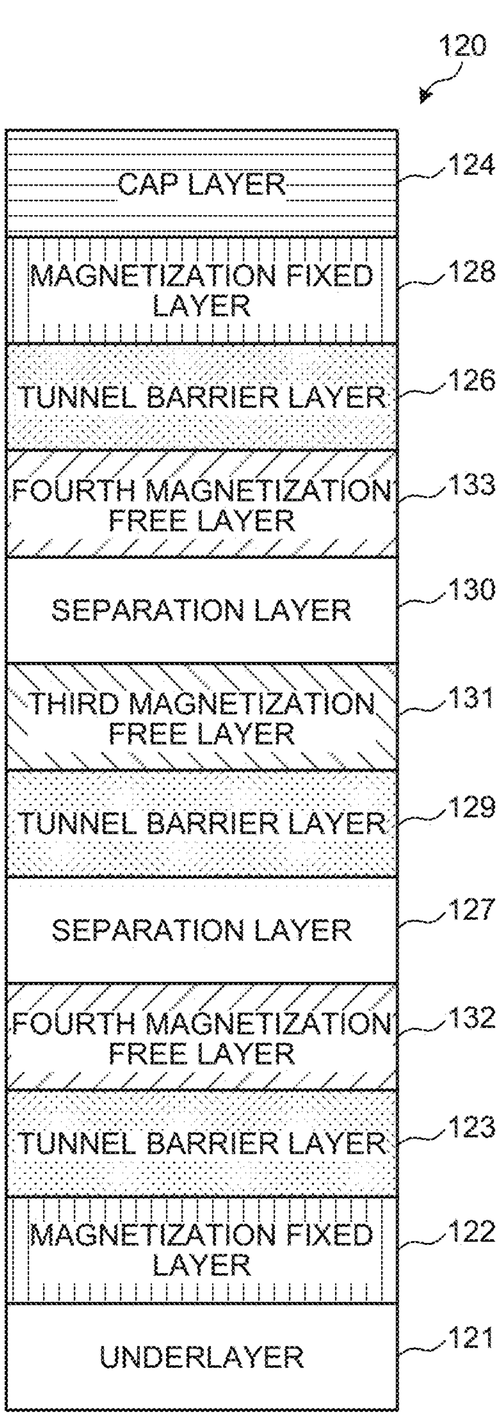
FIG. 19 is a diagram illustrating a configuration example of a magnetoresistive effect element according to a modification of the second embodiment of the present disclosure.

The magnetoresistive effect element 120 of FIG. 19 illustrates an example in which the separation layer 130, the fourth magnetization free layer 133, and a tunnel barrier layer 129 are added to the magnetoresistive effect element 120 of FIG. 17. The separation layer 130, the fourth magnetization free layer 133, and the tunnel barrier layer 129 are stacked in this order and disposed between the third magnetization free layer 131 and the magnetization fixed layer 128.

The configuration of the memory system 1 other than this is similar to the configuration of the memory system 1 according to the first embodiment of the present disclosure, and thus the description thereof will be omitted.

In this manner, the magnetoresistive effect element 120 of the second embodiment of the present disclosure includes the third magnetization free layer 131 in which the perpendicular magnetic anisotropy is lost by application of the write voltage and the fourth magnetization free layer 132 in which the perpendicular magnetic anisotropy is maintained even with application of the write voltage. This makes it possible to simplify writing to the memory cell 100 using the magnetoresistive effect element 120.

3. Modification

It is also possible to use the magnetoresistive effect element 120 that combines the first magnetization free layer 141, the second magnetization free layer 145, and the fourth magnetization free layer 132 described above.

[Configuration of Magnetoresistive Effect Element]

Figure 20:
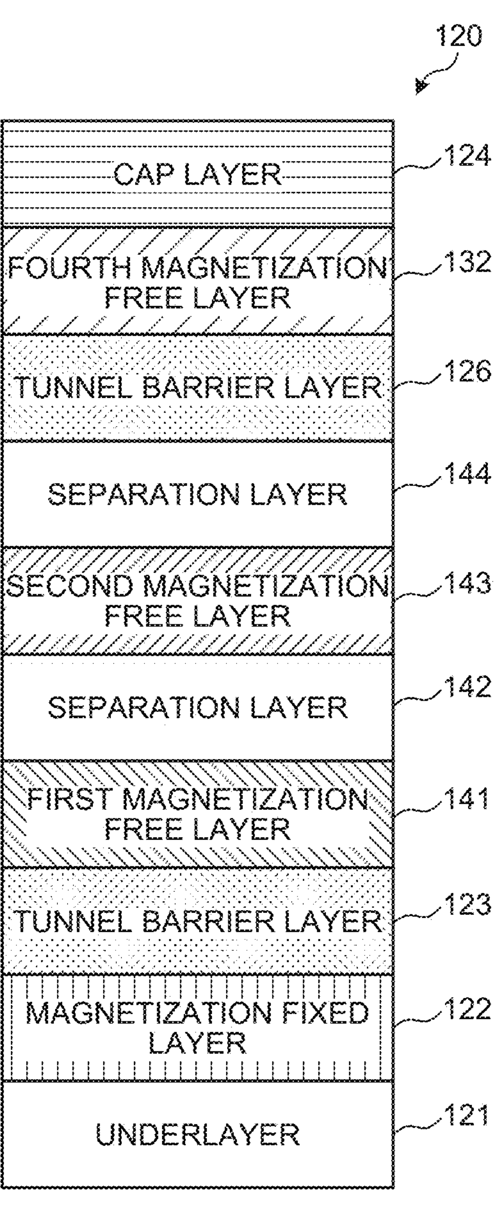
FIG. 20 is a diagram illustrating a configuration example of a magnetoresistive effect element according to a modification of the embodiment of the present disclosure.
Figure 21:
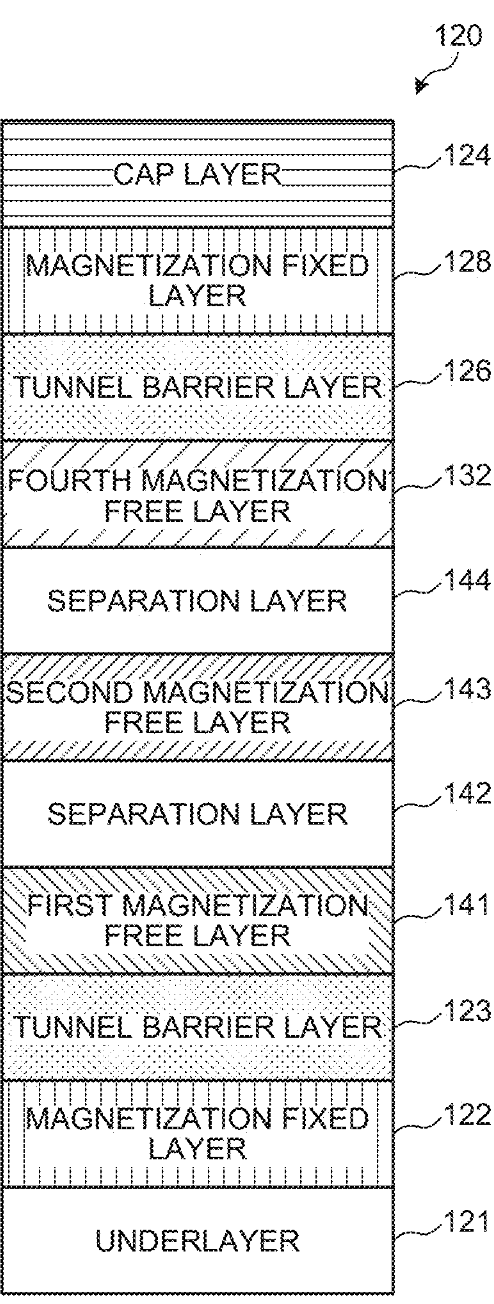
FIG. 21 is a diagram illustrating a configuration example of a magnetoresistive effect element according to a modification of the embodiment of the present disclosure.

FIGS. 20 and 21 are diagrams illustrating a configuration example of a magnetoresistive effect element according to a modification of the embodiment of the present disclosure. Similarly to FIG. 3, FIGS. 20 and 21 are cross-sectional views illustrating a configuration example of the magnetoresistive effect element 120.

The magnetoresistive effect element 120 of FIG. 20 illustrates an example in which the magnetoresistive effect element 120 of FIG. 3 further includes a separation layer 144, a tunnel barrier layer 126, and a fourth magnetization free layer 132. The separation layer 144, the tunnel barrier layer 126, and the fourth magnetization free layer 132 are stacked in this order and disposed between the second magnetization free layer 143 and the cap layer 124.

The magnetoresistive effect element 120 of FIG. 21 illustrates an example in which the magnetoresistive effect element 120 of FIG. 20 further includes the magnetization fixed layer 128. The magnetoresistive effect element 120 in this drawing includes the fourth magnetization free layer 132 and the tunnel barrier layer 126 at positioned interchanged with each other as compared with the magnetoresistive effect element 120 in FIG. 20.

4. Application Examples

[Configuration of Image Processing System]

FIG. 22 is a diagram illustrating a configuration example of an image processing system according to an application example of the embodiment of the present disclosure. The drawing is a block diagram illustrating a configuration example of an image processing system 200 including a logic circuit 210 using the memory system 1. The image processing system 200 includes an imaging element 290 and the logic circuit 210. The logic circuit 210 includes the memory system 1, an ECC processing unit 260, an ADC 220, a frame memory controller 230, an image processing unit 240, and an interface unit 250. Note that the drawing further includes an illustration of the imaging element 290. The logic circuit 210 is a circuit that processes an image signal from the imaging element 290.

The imaging element 290 images a subject and generates an image signal. The imaging element 290 outputs an analog image signal.

The ADC 220 converts the analog image signal from the imaging element 290 into a digital image signal.

The frame memory controller 230 controls the memory system 1 as frame memory.

The image processing unit 240 processes an image signal constituting a frame. The image processing unit 240 can perform image processing and AI processing.

The interface unit 250 outputs image data processed by the image processing unit 240 to an external device.

The ECC processing unit 260 performs ECC processing. The ECC processing unit 260 includes: an encoding unit 261 having an encoding function of adding error correction redundant data at the time of writing; and a composite unit 262 having a decoding function of correcting an error at the time of reading. The error correction function can be used when the error rate of the memory array 4 is high for the purpose.

Figure 23:
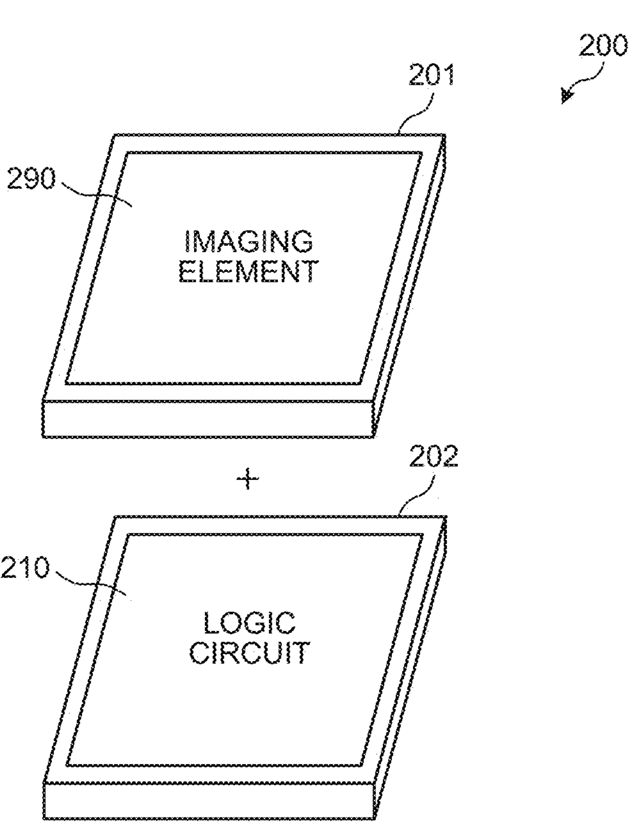
FIG. 23 is a schematic diagram illustrating a configuration example of an image processing system according to the application example of the embodiment of the present disclosure.

FIG. 23 is a schematic diagram illustrating a configuration example of an image processing system according to the application example of the embodiment of the present disclosure. The drawing is a diagram illustrating a configuration example of the image processing system 200. The imaging element 290 in the drawing is disposed on a first semiconductor chip 201. In addition, the logic circuit 210 in the drawing is arranged on a second semiconductor chip 202. The image processing system 200 in the drawing illustrates an exemplary configuration in which the second semiconductor chip 202 and the first semiconductor chip 201 are stacked.

[Write Processing]

Figure 24:
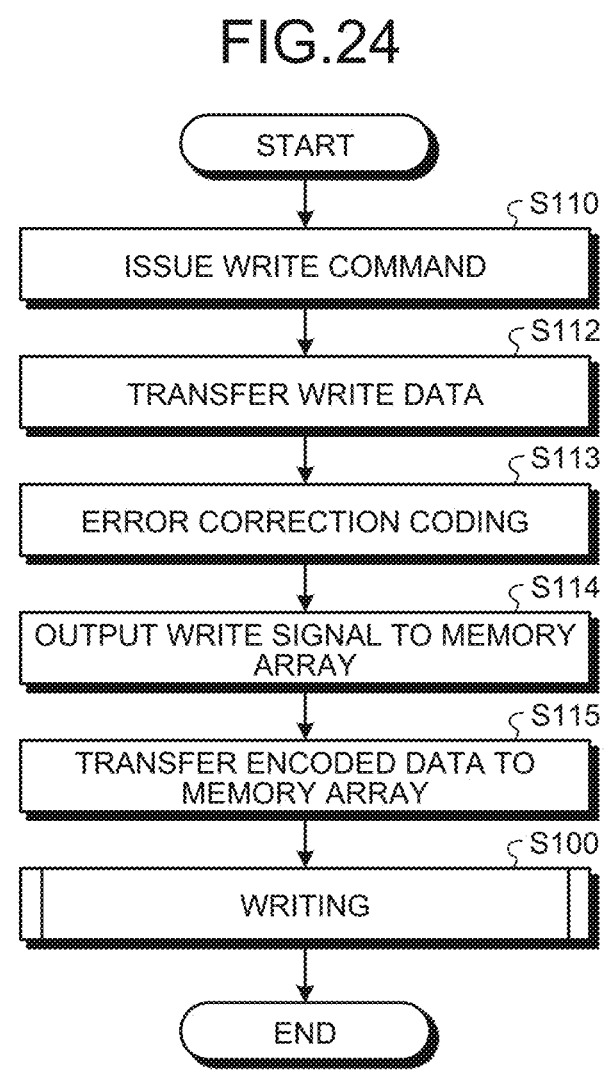

FIG. 24 is a diagram illustrating an example of a processing procedure of write processing of the image processing system according to the application example of the embodiment of the present disclosure. The drawing is a flowchart illustrating an example of write processing in the logic circuit 210. First, the frame memory controller 230 issues a write command (Step S110) and transfers write data (Step S112). Next, the ECC processing unit 260 performs error correction coding (Step S113). Next, the ECC processing unit 260 outputs a write signal to the memory array 4 (Step S114) and transfers the encoded data to the memory array 4 (Step S115). Next, the memory array 4 performs the write processing (Step S100) described with reference to FIG. 6.

[Read Processing]

Figure 25:
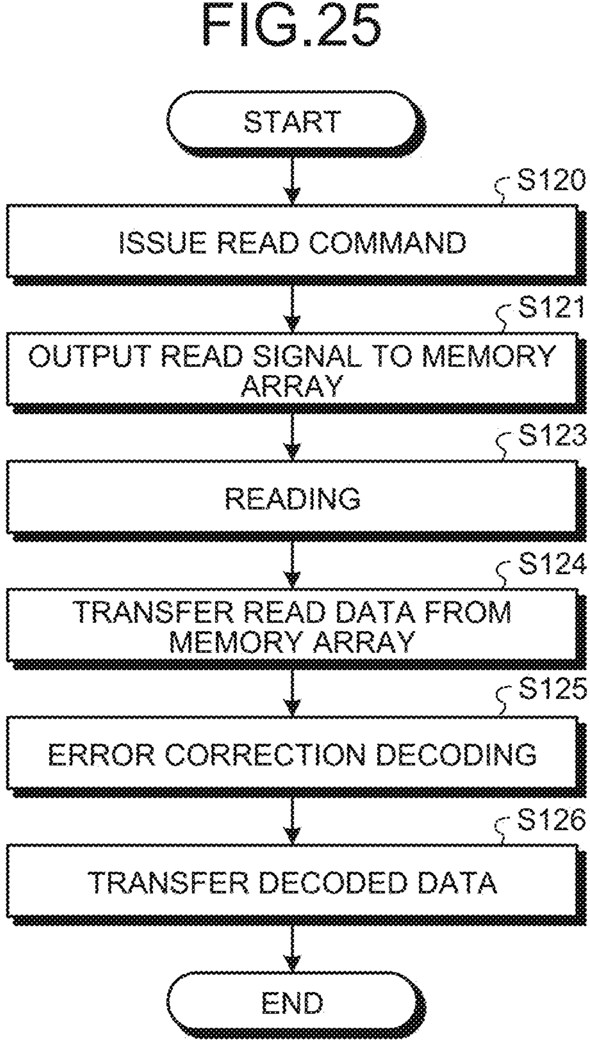
FIG. 25 is a diagram illustrating an example of a processing procedure read processing of the image processing system according to the application example of the embodiment of the present disclosure.

FIG. 25 is a diagram illustrating an example of a processing procedure of read processing of the image processing system according to the application example of the embodiment of the present disclosure. The drawing is a flowchart illustrating an example of write processing in the logic circuit 210. First, the frame memory controller 230 issues a read command (Step S120) and outputs a read signal to the memory array 4 (Step S121). Next, the memory array 4 performs read processing (Step S123). Next, the data read by the memory array 4 is transferred (Step S124). Next, the ECC processing unit 260 performs error correction decoding (Step S125) and transfers decoded data to the frame memory controller 230 (Step S126).

By using the memory array 4 for the image processing system 200, the write error rate is not degraded even when the write pulse width is long, making it possible to reduce a redundant area required for error correction. This also achieves reduction of the number of error correction processing circuits. Furthermore, since the encoding/decoding processing can be simplified, it is possible to reduce the processing delay. This leads to achievement of memory with a low delay as compared with the conventional voltage-controlled MRAM.

The effects described in the present specification are merely examples, and thus, there may be other effects, not limited to the exemplified effects.

Note that the present technique can also have the following configurations.

(1)

Magnetoresistive effect memory comprising a magnetoresistive effect element, the magnetoresistive effect element including: a voltage-controlled magnetic anisotropy effect layer that is a magnetization free layer having a variable magnetization direction and has a voltage-controlled magnetic anisotropy effect; a non-voltage-controlled magnetic anisotropy effect layer that is a magnetization free layer having a variable magnetization direction and that has no voltage-controlled magnetic anisotropy effect; and a magnetization fixed layer having magnetic anisotropy and having an invariable magnetization direction.

(2)

The magnetoresistive effect memory according to the above (1), further comprising a separation layer that separates the voltage-controlled magnetic anisotropy effect layer and the non-voltage-controlled magnetic anisotropy effect layer from each other.

(3)

The magnetoresistive effect memory according to the above (1) or (2), further comprising an in-plane magnetic film that applies a magnetic field to the voltage-controlled magnetic anisotropy effect layer and the non-voltage-controlled magnetic anisotropy effect layer.

(4)

The magnetoresistive effect memory according to any one of the above (1) to (3), wherein the magnetoresistive effect element further includes a tunnel barrier layer disposed adjacent to the voltage-controlled magnetic anisotropy effect layer.

(5)

The magnetoresistive effect memory according to any one of the above (1) to (4), wherein the magnetoresistive effect element further includes a second magnetization fixed layer having magnetic anisotropy and an invariable magnetization direction, and the voltage-controlled magnetic anisotropy effect layer and the non-voltage-controlled magnetic anisotropy effect layer are disposed between the magnetization fixed layer and the second magnetization fixed layer.

(6)

The magnetoresistive effect memory according to any one of the above (1) to (5), further comprising:

a memory cell including the magnetoresistive effect element and a selection element that selects the magnetoresistive effect element;

a write circuit that performs writing to the magnetoresistive effect element via the selection element; and a read circuit that performs reading from the magnetoresistive effect element via the selection element.

(7)

A memory array comprising:

a plurality of memory cells, each of the plurality of memory cells including a magnetoresistive effect element and a selection element, the magnetoresistive effect element including a voltage-controlled magnetic anisotropy effect layer, a non-voltage-controlled magnetic anisotropy effect layer, and a magnetization fixed layer, the voltage-controlled magnetic anisotropy effect layer being a magnetization free layer having a variable magnetization direction and having a voltage-controlled magnetic anisotropy effect, the non-voltage-controlled magnetic anisotropy effect layer being a magnetization free layer having a variable magnetization direction and not having a voltage-controlled magnetic anisotropy effect, the magnetization fixed layer being a layer having magnetic anisotropy and having an invariable magnetization direction, the selection element configured to select the magnetoresistive effect element;

a write circuit that selects the plurality of memo cells and performs writing to the magnetoresistive effect element via the selection element; and a read circuit that selects the plurality of memo cells and performs reading from the magnetoresistive effect element via the selection element.

(8)

A memory system comprising:

a plurality of memory cells, each of the plurality of memory cells including a magnetoresistive effect element and a selection element, the magnetoresistive effect element including a voltage-controlled magnetic anisotropy effect layer, a non-voltage-controlled magnetic anisotropy effect layer, and a magnetization fixed layer, the voltage-controlled magnetic anisotropy effect layer being a magnetization free layer having a variable magnetization direction and having a voltage-controlled magnetic anisotropy effect, the non-voltage-controlled magnetic anisotropy effect layer being a magnetization free layer having a variable magnetization direction and not having a voltage-controlled magnetic anisotropy effect, the magnetization fixed layer being a layer having magnetic anisotropy and having an invariable magnetization direction, the selection element configured to select the magnetoresistive effect element;

a write circuit that selects the plurality of memo cells and performs writing to the magnetoresistive effect element via the selection element;

a read circuit that selects the plurality of memo cells and performs reading from the magnetoresistive effect element via the selection element; and a memory controller that controls data writing and data reading on the plurality of memory cells via the write circuit and the read circuit.

(9)

Magnetoresistive effect memory comprising a magnetoresistive effect element, the magnetoresistive effect element including: a plurality of voltage-controlled magnetic anisotropy effect layers each of which is a magnetization free layer having a variable magnetization direction and having a voltage-controlled magnetic anisotropy effect; and a magnetization fixed layer having magnetic anisotropy and having an invariable magnetization direction.

(10)

The magnetoresistive effect memory according to the above (9), wherein the magnetoresistive effect element further includes a plurality of tunnel barrier layers each disposed adjacent to each of the plurality of voltage-controlled magnetic anisotropy effect layers.

(11)

The magnetoresistive effect memory according to the above (9), wherein the magnetoresistive effect element includes:

a perpendicular magnetic anisotropy lost layer that is the voltage-controlled magnetic anisotropy effect layer in which perpendicular magnetic anisotropy is lost when a predetermined write voltage is applied; and a perpendicular magnetic anisotropy maintained layer that is the voltage-controlled magnetic anisotropy effect layer in which perpendicular magnetic anisotropy is maintained even when the predetermined write voltage is applied.

(12)

The magnetoresistive effect memory according to (9) to (11), further including a separation layer that separates the voltage-controlled magnetic anisotropy effect layer and the non-voltage-controlled magnetic anisotropy effect layer from each other.

(13)

The magnetoresistive effect memory according to (9) to (12), further including an in-plane magnetic film that applies a magnetic field to the voltage-controlled magnetic anisotropy effect layer and the non-voltage-controlled magnetic anisotropy effect layer.

(14)

The magnetoresistive effect memory according to any of (9) to (13), in which the magnetoresistive effect element further includes a second magnetization fixed layer having magnetic anisotropy and an invariable magnetization direction, and the voltage-controlled magnetic anisotropy effect layer and the non-voltage-controlled magnetic anisotropy effect layer are disposed between the magnetization fixed layer and the second magnetization fixed layer.

(15)

The magnetoresistive effect memory according to any of (9) to (14), further including:

a memory cell including the magnetoresistive effect element and a selection element that selects the magnetoresistive effect element;

a write circuit that performs writing to the magnetoresistive effect element via the selection element; and a read circuit that performs reading from the magnetoresistive effect element via the selection element.

(16)

A memory array including:

a plurality of memory cells, each of the memory cells including a magnetoresistive effect element and a selection element, the magnetoresistive effect element including a plurality of voltage-controlled magnetic anisotropy effect layers and a magnetization fixed layer, each of the voltage-controlled magnetic anisotropy effect layers being a magnetization free layer with a variable magnetization direction and having a voltage-controlled magnetic anisotropy effect, the magnetization fixed layer having magnetic anisotropy and having an invariable magnetization direction, the selection element configured to select the magnetoresistive effect element;

a write circuit that selects the plurality of memo cells and performs writing to the magnetoresistive effect element via the selection element; and a read circuit that selects the plurality of memo cells and performs reading from the magnetoresistive effect element via the selection element.

(17)

A memory system including:

a plurality of memory cells, each of the memory cells including a magnetoresistive effect element and a selection element, the magnetoresistive effect element including a plurality of voltage-controlled magnetic anisotropy effect layers and a magnetization fixed layer, each of the voltage-controlled magnetic anisotropy effect layers being a magnetization free layer with a variable magnetization direction and having a voltage-controlled magnetic anisotropy effect, the magnetization fixed layer having magnetic anisotropy and having an invariable magnetization direction, the selection element configured to select the magnetoresistive effect element;

a write circuit that selects the plurality of memo cells and performs writing to the magnetoresistive effect element via the selection element;

a read circuit that selects the plurality of memo cells and performs reading from the magnetoresistive effect element via the selection element; and a memory controller that controls data writing and data reading on the plurality of memory cells via the write circuit and the read circuit.

REFERENCE SIGNS LIST

1 MEMORY SYSTEM
3 MEMORY CONTROLLER
4 MEMORY ARRAY
10 MEMORY CELL ARRAY
100 MEMORY CELL
110 SELECTION ELEMENT
120 MAGNETORESISTIVE EFFECT ELEMENT
121 UNDERLAYER
122, 128 MAGNETIZATION FIXED LAYER
123, 126, 129 TUNNEL BARRIER LAYER
124 CAP LAYER
125 ANISOTROPY INDUCING LAYER
127, 130, 142, 144 SEPARATION LAYER
131 THIRD MAGNETIZATION FREE LAYER
132, 133 FOURTH MAGNETIZATION FREE LAYER
141 FIRST MAGNETIZATION FREE LAYER
143, 145 SECOND MAGNETIZATION FREE LAYER
200 IMAGE PROCESSING SYSTEM
210 LOGIC CIRCUIT

The invention claimed is:

1. A magnetoresistive effect memory, comprising:

a magnetoresistive effect element, wherein the magnetoresistive effect element includes:

a voltage-controlled magnetic anisotropy effect layer, wherein the voltage-controlled magnetic anisotropy effect layer is a first magnetization free layer, the voltage-controlled magnetic anisotropy effect layer has a voltage-controlled magnetic anisotropy effect, and a magnetization direction of the voltage-controlled magnetic anisotropy effect layer is variable;

a non-voltage-controlled magnetic anisotropy effect layer, wherein the non-voltage-controlled magnetic anisotropy effect layer is a second magnetization free layer, a magnetization direction of the non-voltage-controlled magnetic anisotropy effect layer is variable, and the non-voltage-controlled magnetic anisotropy effect layer is a layer without the voltage-controlled magnetic anisotropy effect; and a first magnetization fixed layer having a first magnetic anisotropy, wherein a magnetization direction of the first magnetization fixed layer is invariable.

2. The magnetoresistive effect memory according to claim 1, further comprising:

a separation layer that is between the voltage-controlled magnetic anisotropy effect layer and the non-voltage-controlled magnetic anisotropy effect layer.

3. The magnetoresistive effect memory according to claim 1, further comprising:

an in-plane magnetic film configured to apply a magnetic field to the voltage-controlled magnetic anisotropy effect layer and the non-voltage-controlled magnetic anisotropy effect layer.

4. The magnetoresistive effect memory according to claim 1, wherein the magnetoresistive effect element further includes a tunnel barrier layer, and the tunnel barrier layer is adjacent to the voltage-controlled magnetic anisotropy effect layer.

5. The magnetoresistive effect memory according to claim 1, wherein the magnetoresistive effect element further includes a second magnetization fixed layer having a second magnetic anisotropy, a magnetization direction of the second magnetization fixed layer is invariable, and each of the voltage-controlled magnetic anisotropy effect layer and the non-voltage-controlled magnetic anisotropy effect layer is between the first magnetization fixed layer and the second magnetization fixed layer.

6. The magnetoresistive effect memory according to claim 1, further comprising:

a memory cell including the magnetoresistive effect element and a selection element, wherein the selection element is configured to select the magnetoresistive effect element;

a write circuit configured to perform writing to the magnetoresistive effect element via the selection element; and a read circuit configured to perform reading from the magnetoresistive effect element via the selection element.

7. A memory array, comprising:

a plurality of memory cells, wherein each of the plurality of memory cells includes a magnetoresistive effect element and a selection element, wherein the magnetoresistive effect element includes a voltage-controlled magnetic anisotropy effect layer, a non-voltage-controlled magnetic anisotropy effect layer, and a magnetization fixed layer, the voltage-controlled magnetic anisotropy effect layer is a first magnetization free layer, a magnetization direction of the voltage-controlled magnetic anisotropy effect layer is variable, the voltage-controlled magnetic anisotropy effect layer has a voltage-controlled magnetic anisotropy effect, the non-voltage-controlled magnetic anisotropy effect layer is a second magnetization free layer, a magnetization direction of the non-voltage-controlled magnetic anisotropy effect layer is variable, the non-voltage-controlled magnetic anisotropy effect layer is a layer without the voltage-controlled magnetic anisotropy effect, the magnetization fixed layer has a magnetic anisotropy, a magnetization direction of the magnetization fixed layer is invariable, and the selection element is configured to select the magnetoresistive effect element;

a write circuit configured to perform writing to the magnetoresistive effect element of a first memory cell of the plurality of memory cells via the selection element of the first memory cell; and a read circuit configured to perform reading from the magnetoresistive effect element of a second memory cell of the plurality of memory cells via the selection element of the second memory cell.

8. A memory system, comprising:

a plurality of memory cells, wherein each of the plurality of memory cells includes a magnetoresistive effect element and a selection element, wherein the magnetoresistive effect element includes a voltage-controlled magnetic anisotropy effect layer, a non-voltage-controlled magnetic anisotropy effect layer, and a magnetization fixed layer, the voltage-controlled magnetic anisotropy effect layer is a first magnetization free layer, a magnetization direction of the voltage-controlled magnetic anisotropy effect layer is variable, the voltage-controlled magnetic anisotropy effect layer has a voltage-controlled magnetic anisotropy effect, the non-voltage-controlled magnetic anisotropy effect layer is a second magnetization free layer, a magnetization direction of the non-voltage-controlled magnetic anisotropy effect layer is variable, the non-voltage-controlled magnetic anisotropy effect layer is a layer without the voltage-controlled magnetic anisotropy effect, the magnetization fixed layer has a magnetic anisotropy, a magnetization direction of the magnetization fixed layer is invariable, and the selection element is configured to select the magnetoresistive effect element;

a write circuit configured to perform writing to the magnetoresistive effect element of a first memory cell of the plurality of memory cells via the selection element of the first memory cell;

a read circuit configured to perform reading from the magnetoresistive effect element of a second memory cell of the plurality of memory cells via the selection element of the second memory cell; and a memory controller configured to control the writing via the write circuit and the reading via the read circuit.

9. A magnetoresistive effect memory, comprising:

a magnetoresistive effect element, wherein the magnetoresistive effect element includes:

a plurality of voltage-controlled magnetic anisotropy effect layers, wherein each of the plurality of voltage-controlled magnetic anisotropy effect layers is a magnetization free layer, a magnetization direction of each of the plurality of voltage-controlled magnetic anisotropy effect layers is variable, and each of the plurality of voltage-controlled magnetic anisotropy effect layers has a voltage-controlled magnetic anisotropy effect; and a magnetization fixed layer having a magnetic anisotropy, wherein a magnetization direction of the magnetization fixed layer is invariable.

10. The magnetoresistive effect memory according to claim 9, wherein the magnetoresistive effect element further includes a plurality of tunnel barrier layers, and each of the plurality of tunnel barrier layers is adjacent to a respective voltage-controlled magnetic anisotropy effect layer of the plurality of voltage-controlled magnetic anisotropy effect layers.

11. The magnetoresistive effect memory according to claim 9, wherein the magnetoresistive effect element includes:

a perpendicular magnetic anisotropy lost layer, wherein the perpendicular magnetic anisotropy lost layer is a first voltage-controlled magnetic anisotropy effect layer of the plurality of voltage-controlled magnetic anisotropy effect layers, and a perpendicular magnetic anisotropy of the perpendicular magnetic anisotropy lost layer is lost based on an application of a specific write voltage; and a perpendicular magnetic anisotropy maintained layer, wherein the perpendicular magnetic anisotropy maintained layer is a second voltage-controlled magnetic anisotropy effect layer of the plurality of voltage-controlled magnetic anisotropy effect layers, and a perpendicular magnetic anisotropy of the perpendicular magnetic anisotropy maintained layer is maintained at a time of the application of the specific write voltage.

* * * * *